(12) United States Patent
Shelley et al.

(10) Patent No.: US 10,784,097 B2
(45) Date of Patent: Sep. 22, 2020

(54) ATMOSPHERIC-PRESSURE IONIZATION AND FRAGMENTATION OF MOLECULES FOR STRUCTURAL ELUCIDATION

(71) Applicants: INDIANA UNIVERSITY RESEARCH AND TECHNOLOGY CORPORATION, Indianapolis, IN (US); KENT STATE UNIVERSITY, Kent, OH (US)

(72) Inventors: Jacob T. Shelley, Troy, NY (US); Kelsey L. Williams, Kent, OH (US); Gary M. Hieftje, Bloomington, IN (US); Andrew J. Schwartz, Williamsville, NY (US)

(73) Assignees: Indiana University Research And Technology Corporation, Indianapolis, IN (US); Kent State University, Kent, OH (US)

( * ) Notice: Subject to any disclaimer, the term of this patent is extended or adjusted under 35 U.S.C. 154(b) by 0 days.

(21) Appl. No.: 15/756,011

(22) PCT Filed: Aug. 28, 2016

(86) PCT No.: PCT/US2016/049168
§ 371 (c)(1),
(2) Date: Feb. 27, 2018

(87) PCT Pub. No.: WO2017/040359
PCT Pub. Date: Mar. 9, 2017

(65) Prior Publication Data
US 2018/0247804 A1 Aug. 30, 2018

Related U.S. Application Data

(60) Provisional application No. 62/211,595, filed on Aug. 28, 2015.

(51) Int. Cl.
*H01J 49/14* (2006.01)
*G01N 27/62* (2006.01)

(52) U.S. Cl.
CPC ......... *H01J 49/145* (2013.01); *G01N 27/622* (2013.01)

(58) Field of Classification Search
USPC ....................................................... 250/288
See application file for complete search history.

(56) References Cited

U.S. PATENT DOCUMENTS

| 7,929,138 B1* | 4/2011 | Webb ............... G01N 21/69 356/344 |
| 2005/0118599 A1* | 6/2005 | Pawliszyn ......... A61B 10/0045 435/6.12 |

(Continued)

FOREIGN PATENT DOCUMENTS

WO 2015/010212 A1 1/2015

OTHER PUBLICATIONS

Webb, et al., "Spectroscopic characterization of ion and electron populations in a solution-cathode glow discharge" J. Anal. At. Spectrom., 2006, 21, 525-530.

(Continued)

*Primary Examiner* — Kiet T Nguyen
(74) *Attorney, Agent, or Firm* — Barnes & Thornburg LLP

(57) ABSTRACT

A solution-cathode glow discharge (SCGD) spectrometry apparatus may comprise an SCGD source and a mass or ion mobility spectrometer. A method for ionizing a molecular analyte may comprise contacting the molecular analyte with a plasma discharge to form ions and separating the ions in a mass spectrometer or ion mobility spectrometer. The contacting step may occur under atmospheric pressure and/

(Continued)

or ambient conditions. The molecular analyte may be fragmented by the plasma discharge.

18 Claims, 26 Drawing Sheets

(56) References Cited

U.S. PATENT DOCUMENTS

| | | | | |
|---|---|---|---|---|
| 2009/0090856 | A1* | 4/2009 | Grant | G01N 33/6848 |
| | | | | 250/282 |
| 2009/0278038 | A1* | 11/2009 | Baumbach | G01N 27/622 |
| | | | | 250/282 |
| 2011/0042560 | A1* | 2/2011 | Ouyang | H01J 27/022 |
| | | | | 250/282 |
| 2011/0253903 | A1 | 10/2011 | Sun et al. | |
| 2013/0103337 | A1 | 4/2013 | Eiler | |
| 2013/0260478 | A1 | 10/2013 | Ewing et al. | |
| 2014/0263202 | A1* | 9/2014 | Partridge | H05H 1/30 |
| | | | | 219/121.48 |
| 2014/0370613 | A1* | 12/2014 | Stevens | G01N 27/70 |
| | | | | 436/153 |
| 2015/0318159 | A1* | 11/2015 | Badiei | H01J 49/005 |
| | | | | 250/282 |
| 2016/0013037 | A1* | 1/2016 | Jorabchi | H01J 49/105 |
| | | | | 73/23.37 |
| 2016/0254133 | A1* | 9/2016 | Lopez-Avila | H01J 49/102 |
| | | | | 250/282 |
| 2017/0097304 | A1* | 4/2017 | Schroeder | G01N 21/67 |

OTHER PUBLICATIONS

PCT International Search Report, Invitation to Pay Fees, and Written Opinion completed by the ISA/US dated Dec. 12, 2016 and issued in connection with PCT/US2016/049168.

Nick S. Wedd, Peptide Mass Spectrum Interpretation, last updated Jul. 11, 2007, http://www.weddslist.com/ms/index.html.

Nick S. Wedd, Tandem Peptide Spectrum Interpretation, last updated Jul. 11, 2007, http://www.weddslist.com/ms/tandem.html.

* cited by examiner

ATMOSPHERIC-PRESSURE IONIZATION AND FRAGMENTATION OF MOLECULES FOR STRUCTURAL ELUCIDATION

This application is a national stage entry under 35 U.S.C. § 371 of PCT International Application No. PCT/US2016/049168, filed Aug. 28, 2016, and claims the benefit of priority under 35 U.S.C. § 119(e) to U.S. Provisional Patent Application No. 62/211,595, filed Aug. 28, 2015, the disclosures of which are expressly incorporated by reference in their entireties.

GOVERNMENT RIGHTS

This invention was made with government support under grant number DE-FG02-98ER14890 awarded by the Department of Energy. The Government has certain rights in the invention.

TECHNICAL FIELD

This disclosure relates generally to apparatuses and methods for spectrometry, and more specifically to apparatuses and methods for generating ions at atmospheric pressure for spectrometry. This disclosure also relates to peptide and protein sequencing and to determining the speciation (bonding, chemical form, nearest neighbors) of the chemical elements within a sample.

BACKGROUND

State-of-the-art molecular analysis, including proteomics, requires special and costly mass-spectrometry instrumentation to obtain molecular structure information, such as sequence information or the species bound to chosen chemical elements. Currently, the proteomics and speciation fields use tandem MS approaches. Proteomic analysis often employs electrospray ionization and tandem mass spectrometry, which are limited to special instrumentation, to determine the structural identity of target species.

Commonly used methods for proteomic analysis include collision-induced dissociation (CID). Though widely utilized, CID suffers from two major weaknesses: incomplete sequence coverage and the inability to preserve labile modifications. CID fragmentation of larger biomolecules becomes increasingly difficult as a result of increased degrees of freedom through which energy can be distributed, and such methods are mostly useful for small (<3 kDa) peptides. Post-translational modifications, such as phosphorylation or glycosylation, are often lost prior to cleavage of peptide bonds when using such methods. In the case of CID, a complex instrument capable of extracting ions within a desired mass-to-charge (m/z) range in conjunction with a collision cell is employed (e.g., triple quadrupole, ion trap, etc.).

Methods that induce fragmentation by transfer of an electron or other charged entity to the peptide, such as electron-capture dissociation (ECD), electron-transfer dissociation (ETD), and charge-transfer dissociation (CTD) have also become common. Some drawbacks to ECD, ETD, and CTD include that they induce charge reduction upon fragmentation, so only multiply charged peptides and proteins can be subjected to ECD/ETD/CTD, and that stearic hindrance prevents the fragmentation reactions from occurring at proline residues. Electron-transfer dissociation presents additional complexity as the instrument (most commonly an ion trap) is equipped with a secondary ionization source and associated ion optics for generation of reagent anions. Further, the instrument should be able to combine and trap precursor cations with anionic reagents, terminate the reaction, and detect product fragments. In ECD, precursor ions are immersed in a high number density of low-energy, free electrons. Because free electrons are not efficiently retained at low energies within radiofrequency fields of quadrupolar ion traps, ECD remains a technique that is limited to the static magnetic field provided by Fourier transform ion cyclotron resonance mass spectrometers, an expensive type of mass analyzer.

All of the aforementioned methods are further complicated by reduced-pressure requirements. At atmospheric pressure, the mean free path is short (<100 nm) and frequent collisions lead to complications for the aforementioned dissociation pathways, when using such methods.

Reported methods of atmospheric-pressure peptide fragmentation have utilized an electrospray-ionization (ESI) source to generate gas-phase peptide cations. These cations are directed to a secondary source, such as a photoionization lamp, to promote dissociation. Such methods achieve fragmentation at atmospheric pressure, but a combination of two sources, ESI and a secondary source for fragmentation, is included.

The solution-cathode glow discharge (SCGD) relates to a plasma-based method and apparatus useful for a variety of chemical analyses. An example of the SCGD is disclosed in Webb, et al. J. Anal. At. Spectrom., 2006, 21, 525-530; the Experimental section of which is incorporated herein by reference. The design of the SCGD is based on the technology utilized in fluorescent lights; that of a 'glow discharge'. In their simplest form, glow discharges result from low-pressure gas that separates two metal plates (electrodes). Application of a high voltage across the metal plates results in the electrical breakdown of the gas and formation of a plasma. The SCGD closely follows this basic design, but with two modifications. First, the SCGD may be operated at atmospheric pressure, as opposed to a reduced-pressure environment (reducing complexity as no vacuum pump or chamber is required). Second, in the SCGD, one of the metal electrodes is replaced with a flowing liquid solution (usually the sample to be analyzed). Application of a high voltage between a metal electrode and the solution results in the formation of a glow discharge that is sustained on the surface of the liquid.

Previously, the SCGD has been used for elemental analysis through the measurement of optical emission from excited-state atomic species within the plasma. The conditions associated with the SCGD would be expected to be incompatible with studying the properties of molecular analytes because of the very high energy conditions of the SCGD, the high acid concentrations used with the SCGD, and previous studies suggesting low ionization efficiencies using the SCGD. Moreover, the prior art suggests that the SCGD would not have been a competitive ionization source for atomic species when compared to the inductively coupled plasma (Webb, et al. J. Anal. At. Spectrom., 2006, 21, 525-530).

Accordingly, there is a need for more economical methods of spectrometry, including methods sensitive enough for proteomic applications.

SUMMARY

Several embodiments of the invention are described by the following enumerated clauses:

1. A method for ionizing a molecular analyte, the method comprising:
contacting the molecular analyte with a plasma discharge to form ions and
separating the ions in a mass spectrometer or an ion mobility spectrometer.
2. The method of clause 1, wherein the contacting step occurs under atmospheric pressure.
3. The method of clause 1 or 2, wherein the contacting step occurs under ambient conditions.
4. The method of any one of the preceding clauses, wherein the molecular analyte is fragmented by the plasma discharge.
5. The method of any one of the preceding clauses, wherein the molecular analyte is not multiply charged.
6. The method of any one of the preceding clauses, wherein the molecular analyte is electrically neutral.
7. The method of any one of the preceding clauses, wherein the molecular analyte is not subjected to a subsequent fragmenting step after the contacting step.
8. The method of any one of the preceding claims, wherein the contacting step comprises flowing an electrically conductive liquid through a capillary onto a first conductive rod that surrounds the capillary and applying an electric potential to at least one of the first conductive rod, the electrically conductive liquid, and a second conductive rod spaced apart from the electrically conductive liquid such that the plasma discharge forms between the second conductive rod and the electrically conductive liquid to produce the ions.
9. The method of clause 8, wherein the molecular analyte is dissolved in the electrically conductive liquid.
10. The method of any one of the preceding clauses, wherein the molecular analyte is a solid.
11. The method of any one of the preceding clauses, wherein the molecular analyte is a gas.
12. The method of any one of the preceding clauses, wherein the molecular analyte is a biomolecule.
13. The method of any one of the preceding clauses, wherein the molecular analyte is a polypeptide.
14. The method of any one of the preceding clauses, wherein the molecular analyte is a protein.
15. The method of any one of the preceding clauses, wherein the ions are polypeptide sequence ions each having a type selected from the group consisting of a-ions, b-ions, c-ions, x-ions, y-ions, z-ions, d-ions, v-ions, and w-ions.
16. The method of any one of the preceding clauses, wherein the ions are polypeptide sequence ions each having a type selected from the group consisting of a-ions, b-ions, c-ions, x-ions, y-ions, d-ions, v-ions, and w-ions.
17. The method of any one of clauses 13 to 16, wherein the polypeptide has been digested with an enzyme.
18. The method of any one of clauses 13 to 17, further comprising sequencing the polypeptide.
19. The method of any one of the preceding clauses, wherein the molecular analyte is a chemical complex.
20. The method of any one of the preceding clauses, wherein the molecular analyte is a charged molecular analyte.
21. The method of any one of the preceding clauses, further comprising passing the ions to a detector.
22. The method of any one of the preceding clauses, wherein the plasma discharge is generated by an electric current of about 1 mA to about 200 mA.
23. The method of any one of the preceding clauses, wherein the plasma discharge is generated by an electric current of about 35 mA to about 95 mA.
24. The method of any one of the preceding clauses, further comprising varying the electric current.
25. The method of clause 24, wherein the current is varied between a high current and a low current.
26. The method of clause 25, wherein the high current is from about 50 mA to about 200 mA.
27. The method of clause 25 or 26, wherein the low current is from about 1 mA to about 50 mA.
28. The method of any one of the preceding clauses, wherein the method does not comprise reducing pressure where the plasma discharge forms.
29. The method of any one of the preceding clauses, wherein the molecular analyte is dissolved in an electrically conductive liquid that flows toward the plasma discharge at a rate of about 0.01 mL/min to about 10 mL/min
30. The method of any one of the preceding clauses, wherein the molecular analyte is dissolved in an electrically conductive liquid that flows toward the plasma discharge at a rate of about 1 mL/min to about 5 mL/min
31. The method of any one of the preceding clauses, wherein the molecular analyte is dissolved in an electrically conductive liquid that comprises an electrolyte solute.
32. The method of clause 31, wherein the electrolyte solute is selected from the group consisting of nitric acid, hydrochloric acid, and sulfuric acid.
33. The method of clause 31 or 32, wherein the electrolyte solute comprises hydrochloric acid.
34. The method of any one of clauses 31 to 33, wherein the concentration of the electrolyte solute is about 0.05M to about 2M.
35. The method of any one of clauses 31 to 34, wherein the concentration of the electrolyte solute is about 0.05M to about 0.2M.
36. The method of any one of clauses 31 to 35, wherein the electrolyte solute comprises acetic acid.
37. The method of any one of the preceding clauses, wherein the plasma discharge is about 0.2 cm to about 10 cm from an inlet of the spectrometer.
38. The method of any one of the preceding clauses, wherein the plasma discharge is about 0.2 cm to about 1 cm from an inlet of the spectrometer.
39. A solution-cathode glow discharge spectrometry apparatus comprising:
a solution-cathode glow discharge source for producing ions from an analyte; and
a mass spectrometer coupled to the solution-cathode glow discharge source to detect the ions.
40. The solution-cathode glow discharge spectrometry apparatus of claim 39, wherein the mass spectrometer comprises an inlet and the solution-cathode glow discharge source produces a glow discharge about 0.2 cm to about 10 cm from the inlet.
41. The solution-cathode glow discharge spectrometry apparatus of claim 39, wherein the mass spectrometer comprises an inlet and the solution-cathode glow discharge source produces a glow discharge about 0.2 cm to about 1 cm from the inlet.
42. A solution-cathode glow discharge spectrometry apparatus comprising:
a solution-cathode glow discharge source for producing ions from an analyte; and an ion mobility spectrometer coupled to the solution-cathode glow discharge source to detect the ions.

43. The solution-cathode glow discharge spectrometry apparatus of claim 42, wherein the ion mobility spectrometer comprises an inlet and the solution-cathode glow discharge source produces a glow discharge about 0.2 cm to about 10 cm from the inlet.

44. The solution-cathode glow discharge spectrometry apparatus of claim 42, wherein the ion mobility spectrometer comprises an inlet and the solution-cathode glow discharge source produces a glow discharge about 0.2 cm to about 1 cm from the inlet.

45. The solution-cathode glow discharge spectrometry apparatus of any one of claims 39 to 44, wherein the apparatus does not comprise a second energy source for fragmenting the ions.

46. The solution-cathode glow discharge spectrometry apparatus of any one of claims 39 to 45, wherein the solution-cathode glow discharge source is not coupled to a pressure-reducing device.

47. The solution-cathode glow discharge spectrometry apparatus of any one of claims 39 to 46, wherein the solution-cathode glow discharge source comprises:
a first conductive rod having a first end;
a capillary having a tip facing toward the first end of the first conductive rod;
a second conductive rod surrounding the capillary such that the tip is not in contact with the second conductive rod; and
a power source electrically coupled between the first and second conductive rods and configured to apply a current such that, when a conductive solution exits the tip of the capillary and contacts the second conductive rod, a glow discharge forms between the conductive solution and the first conductive rod.

48. The solution-cathode glow discharge spectrometry apparatus of claim 47, wherein the capillary tip extends about 1 mm to about 5 mm beyond the second conductive rod.

49. The solution-cathode glow discharge spectrometry apparatus of claim 47 or 48, wherein the first end of the first conductive rod is pointed.

50. The solution-cathode glow discharge spectrometry apparatus of any one of claims 47 to 49, further comprising a ground electrically coupled to the second conductive rod.

51. The solution-cathode glow discharge spectrometry apparatus of any one of claims 47 to 50, wherein the power source is configured to apply a current of about 1 mA to about 200 mA.

52. The solution-cathode glow discharge spectrometry apparatus of any one of claims 47 to 51, wherein the distance between the first end of the first conductive rod and the tip of the capillary is about 0.5 mm to about 5 mm 53. The solution-cathode glow discharge spectrometry apparatus of any one of claims 47 to 52, wherein the first conductive rod comprises tungsten or titanium.

54. The solution-cathode glow discharge spectrometry apparatus of any one of claims 47 to 53, wherein the second conductive rod comprises graphite.

BRIEF DESCRIPTION OF THE DRAWINGS

The invention may best be understood by referring to the following detailed description and accompanying drawings which illustrate embodiments of the invention. In the drawings.

DETAILED DESCRIPTIONS OF ILLUSTRATIVE EMBODIMENTS

Figure 1:
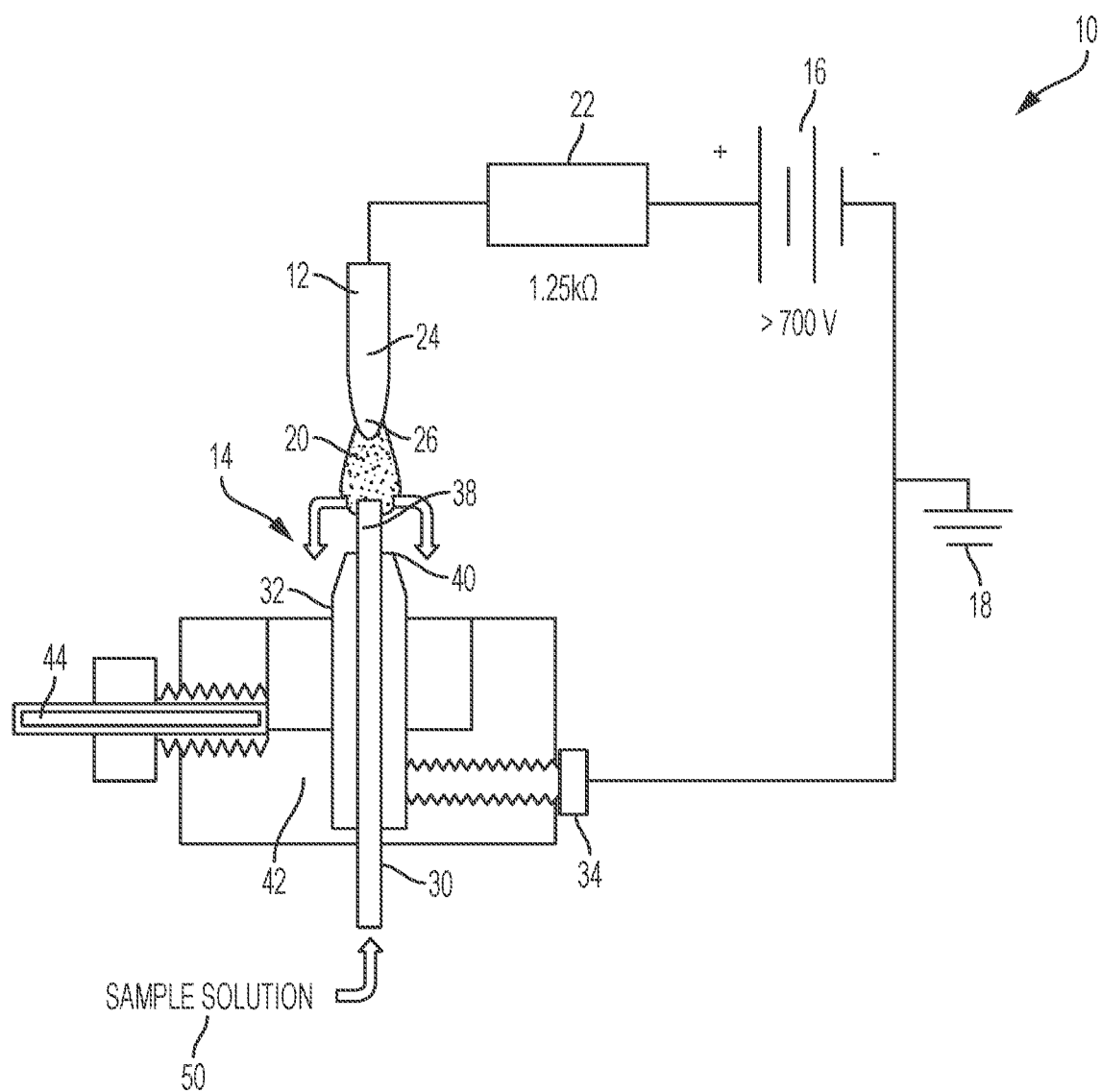
FIG. 1 is a schematic diagram of a solution-cathode glow discharge (SCGD) cell.

While the concepts of the present disclosure are susceptible to various modifications and alternative forms, specific illustrative embodiments and methods thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention.

References in the specification to "one embodiment", "an embodiment", "an illustrative embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The illustrative embodiments described herein include methods for ionizing an analyte. In such methods, a solution-cathode glow discharge (SCGD) is used as an ionization source for mass spectrometry or ion mobility spectrometry. Molecules or other target species in solution are brought into the gas phase and ionized by an electrical discharge (i.e. plasma) sustained on a liquid surface; this plasma is termed the solution-cathode glow discharge. In some embodiments, samples are ionized and controllably fragmented directly from bulk solution. The plasma vaporizes a portion of the liquid, and chemical substances contained therein, which are excited and/or ionized within the plasma. Surprisingly, the chemical species can be controllably fragmented using the SCGD at atmospheric pressure, by adjusting the plasma conditions, such as by adjusting voltage and current. Advantageously, the SCGD may be interfaced to an existing mass spectrometer or ion mobility spectrometer to measure the masses of intact and fragment ions and identify the structures, as well as identities, of analyte molecules. The ability to fragment molecules at atmospheric pressure makes structural elucidation more accessible to spectrometry users as it can be interfaced with any atmospheric-pressure inlet spectrometry instrument.

As the liquid contacts the electrical discharge, solutes such as peptides are volatilized, ionized, and fragmented. At high discharge currents (e.g., 70 mA), electrospray-like spectra may be observed, dominated by singly and doubly protonated molecular ions. At lower currents (35 mA), peptides may exhibit extensive fragmentation, with a-, b-, c-, x-, and y-type ion series present as well as complex fragments, such as d-type ions, not previously observed with atmospheric-pressure dissociation. Without being bound by theory, the differences in spectra between the SCGD current levels suggests that ionization and fragmentation of peptides occur very near or within the plasma and not as a result of other factors (e.g. thermal decomposition in the heated capillary). It also demonstrates that peptide fragmentation within the SCGD is controllably tunable by adjustment of source parameters. In some embodiments, high-current operation provides a softer, more ESI-like spectrum, whereas the low-current mode produces extensive fragmentation useful for structural elucidation.

As further described in the Examples, SCGD fragmentation patterns differ substantially from those in atmospheric-pressure ECD, or reduced-pressure ECD and ETD. Both atmospheric-pressure ECD and reduced-pressure ECD/ETD produce primarily series of c- and z-ions and comparatively minor amounts of a- and y-ions. If either ECD or ETD were a significant pathway to dissociation in the SCGD, the absent z-type ions should also be prominent in the spectra. In addition to these observations, the SCGD mass spectra reveal that fragmentation occurred at proline residues, which is not found with either ECD or ETD.

Unlike earlier atmospheric-pressure fragmentation methods, ionization and fragmentation are consolidated into a single source and peptide fragmentation is controllably tunable by simple adjustment of electrical current in the discharge. Counterintuitively, when used with polypeptides, higher currents may produce intact molecular ions and more ESI-like spectra, while lower currents may yield extensive fragmentation to form a-, b-, c-, x-, y- and even d-type ion series. This tunable ionization source for biological spectrometry provides improved sequence coverage over CID, and offers a simple ionization/fragmentation platform adaptable to many atmospheric-pressure inlet spectrometers.

The methods and apparatuses disclosed here have utility in the same application areas as tandem mass spectrometry, which include environmental sciences (e.g., detection of pollutants in wastewater), pharmaceuticals (e.g., cleaning validation after synthesis of a pharmaceutical), forensics (measurement of illicit drugs/drug metabolites in bodily fluids), homeland security (rapid screening of samples for explosives), and the biosciences (sequencing of newly discovered peptides or proteins).

With a spectrometry detector, the masses of the intact and fragment ions are measured and molecular or other chemical structure can be determined. The types of molecules that can be detected include small rigid molecules such as caffeine, methamphetamine, and the like, or large labile molecules such as proteins, peptides, and the like. In some embodiments, the fragmentation spectra of fragile biopolymers are interpreted for determining their sequences. Advantageously, the simple fragmentation spectra of biomolecules (peptides and proteins) allows for rapid elucidation of biopolymer sequence making the device useful for proteomic analyses.

It was found that a wide variety of chemical species may be detected with an SCGD mass spectrometry (SCGD-MS) configuration described herein. Types of analytes that were detected thus far included bare or complexed elemental species, small, polar organic molecules (such as chemical warfare agent simulants, illicit drugs, etc.), non-polar molecules (such as trichloroanisole, naphthalene, biphenyl, etc.), and large, labile biopolymers (such as peptides and proteins). Surprisingly, the fragmentation and therefore structure of fragile biopolymers, such as polypeptides, was very easy to interpret directly from the mass spectrum.

Referring now to FIG. 1, a diagrammatic view of a SCGD cell 10 of the present disclosure is shown. The SCGD cell 10 comprises an anode rod 12 and a cathode assembly 14. The anode rod 12 is coupled to a power supply 16, and the cathode assembly 14 is coupled to electrical ground 18. When the power supply 16 applies a voltage to the anode rod 12, electrical breakdown in the air between the anode rod 12 and the cathode assembly 14 results in the formation of a plasma discharge 20 between the anode rod 12 and the cathode assembly 14. It is contemplated that, in other embodiments, the electric potential may be applied to the assembly 14 and the rod 12 may be grounded.

The anode rod 12 has a body 24 leading to a point 26. The body 24 has cylindrical shape and the point 26 has a substantially conical or substantially frustoconical shape. In some embodiments, the diameter of the body 24 is 3.3 mm. In some embodiments the contact angle between the body 24 and the point 26 is about 15°. The anode rod 12 is made of a conductive material. In some embodiments, the anode rod 12 is made of a conductive metal. Examples of preferred conductive metals are tungsten or titanium. The anode rod 12 is electrically coupled to the power supply 16 with a resistor 22 residing therebetween. In some embodiments, the resistor is a 1.25-kΩ ballast resistor. The power supply 16 and resistor 22 are configured to apply a voltage to the anode rod 12 of about 400 V to about 1300 V, about 500 V to about 1300 V, about 600 V to about 1300 V, about 700 V to about 1300 V, about 400 V to about 1200 V, about 500 V to about 1200 V, about 600 V to about 1200 V, about 700 V to about 1200 V, about 400 V to about 1100 V, about 500 V to about 1100 V, about 600 V to about 1100 V, about 700 V to about 1100 V, about 400 V to about 1000 V, about 500 V to about 1000 V, about 600 V to about 1000 V, about 700 V to about 1000 V, about 400 V to about 900 V, about 500 V to about 900 V, about 600 V to about 900 V, about 700 V to about 900 V, about 400 V to about 800 V, about 500 V to about 800 V, about 600 V to about 800 V, about 700 V to about 800 V, or over about 700 V. The power supply 16 and resistor 22 are also configured to send a current to the anode rod 12 of about 1 mA to about 200 mA, about 10 mA to about 150 mA, about 10 mA to about 100 mA, about 10 mA to about 90 mA, about 10 mA to about 80 mA, about 10 mA to about 70 mA, about 20 mA to about 100 mA, about 20 mA to about 90 mA, about 20 mA to about 80 mA, about 20 mA to about 70 mA, about 30 mA to about 100 mA, about 30 mA to about 90 mA, about 30 mA to about 80 mA, or about 35 mA to about 95 mA. Current and voltage applied to the anode rod 12 may be modulated by configurations other than the one described herein. Current and voltage may be varied depending on the desired properties of ions resulting from an analyte used with the SCGD cell 10. In some embodiments, current is varied between a high current and a low current for different types of ionization. The high current is about 50 mA to about 200 mA, about 60 mA to about 200 mA, about 50 mA to about 150 mA, about 60 mA to about 150 mA, about 50 mA to about 100 mA, about 60 mA to about 100 mA, about 50 mA to about 90 mA, or about 60 mA to about 90 mA. The low current is about 1 mA to about 50 mA, about 10 mA to about 50 mA, about 20 mA to about 50 mA, about 30 mA to about 50 mA, about 1 mA to about 40 mA, about 10 mA to about 40 mA, about 20 mA to about 40 mA, or about 30 mA to about 40 mA. In some embodiments, the power supply 16 provides less than 100 W or about 35 W to about 80 W direct-current power.

Still referring to FIG. 1, the cathode assembly 14 comprises a capillary 30, a cathode rod 32, a grounding screw 34, and a ground 18. A tip 38 of the capillary 30 is oriented toward the point 26 of the anode rod 12. The capillary 30 is surrounded by the cathode rod 32 such that the tip 38 of the capillary 30 extends beyond a contact end 40 of the cathode rod 32. In some embodiments, the capillary 30 does not include a sample-solution nebulizer or spray chamber. The grounding screw 34 is in electrical contact with the cathode rod 32 to couple the cathode rod 32 to the ground 18.

In some embodiments, the capillary 30 is made of glass and has an inner diameter from about 0.05 mm to about 4 mm, about 0.05 mm to about 2 mm, about 0.05 mm to about 1 mm, about 0.05 mm to about 0.5 mm, about 0.2 mm to about 4 mm, about 0.2 mm to about 2 mm, about 0.2 mm to about 1 mm, about 0.2 mm to about 0.5 mm, about 0.3 mm to about 4 mm, about 0.3 mm to about 2 mm, about 0.3 mm to about 1 mm, or about 0.3 mm to about 0.5 mm. In some embodiments, the capillary 30 has an inner diameter of about 0.38 mm and an outer diameter of about 1.1 mm. The inner diameter is large enough to allow for a sufficient flow rate to sustain a glow discharge, as further described hereinbelow.

The cathode rod 32 is made of a conductive material. Preferably, the material is resistant to oxidation when exposed to the conductive sample solutions 50 described herein. In some embodiments, the cathode rod 32 comprises graphite.

The distance between the tip 38 of the capillary 30 and the contact end 40 of the cathode rod 32 is about 1 mm to about 5 mm, about 2 mm to about 5 mm, about 3 mm to about 5 mm, about 1 mm to about 4 mm, about 2 mm to about 4 mm, about 3 mm to about 4 mm, about 1 mm to about 3 mm, about 2 mm to about 3 mm, or preferably about 3 mm.

The cathode assembly 14 further comprises a waste basin 42 and a drain 44. The waste basin 42 surrounds the cathode rod 32 and capillary 30 such that when conductive sample solution 50 flows from the capillary 30 and is not consumed by the discharge 20, the conductive sample solution 50 is caught by the waste basin 42 and also forms an electrically conductive path between the solution at the tip of the capillary 30 and the cathode rod 32, and thence to electrical ground 18. The drain 44 is coupled to the waste basin 42 such that the conductive sample solution 50 caught in the waste basin 42 exits via the drain 44. The waste basin 42 is made of a nonconductive, chemical resistant material, such as polytetrafluoroethylene.

Figure 10:
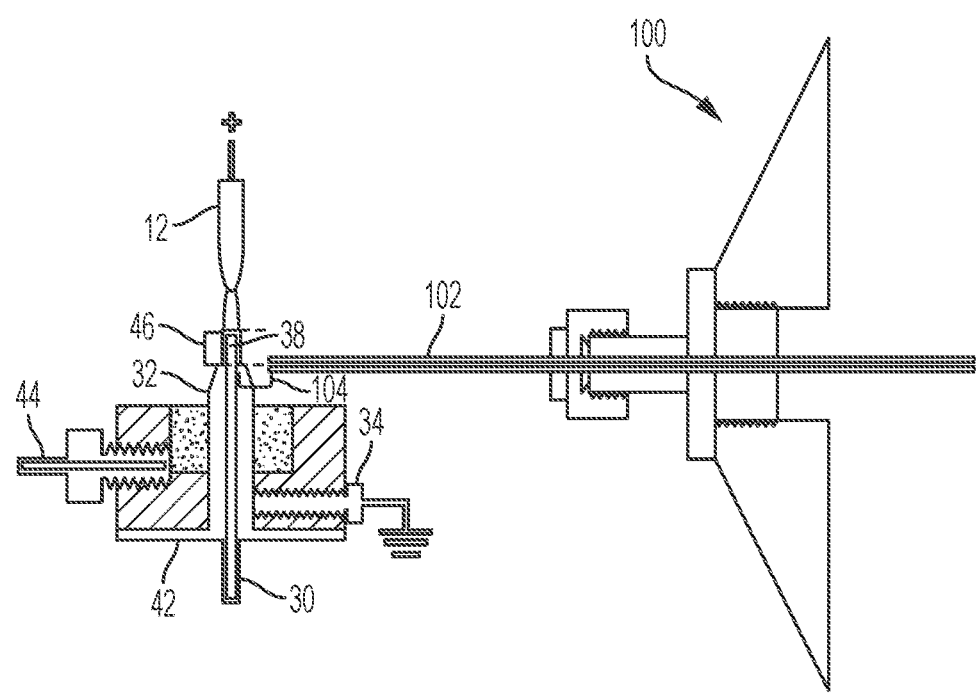
FIG. 10 is a schematic diagram of a mass spectrometer inlet capillary with respect to the SCGD of FIG. 1.

Referring to FIGS. 1 and 10, the distance 46 between the point 26 of the anode rod 12 and the tip 38 of the capillary 30 is about 0.5 mm to about 10 mm, about 1 mm to about 10 mm, about 2 mm to about 10 mm, 0.5 mm to about 5 mm, about 1 mm to about 5 mm, about 2 mm to about 5 mm, about 0.5 mm to about 4 mm, about 1 mm to about 4 mm, about 2 mm to about 4 mm, about 0.5 mm to about 3 mm, about 1 mm to about 3 mm, about 2 mm to about 3 mm, or about 2.5 mm.

Figure 2:
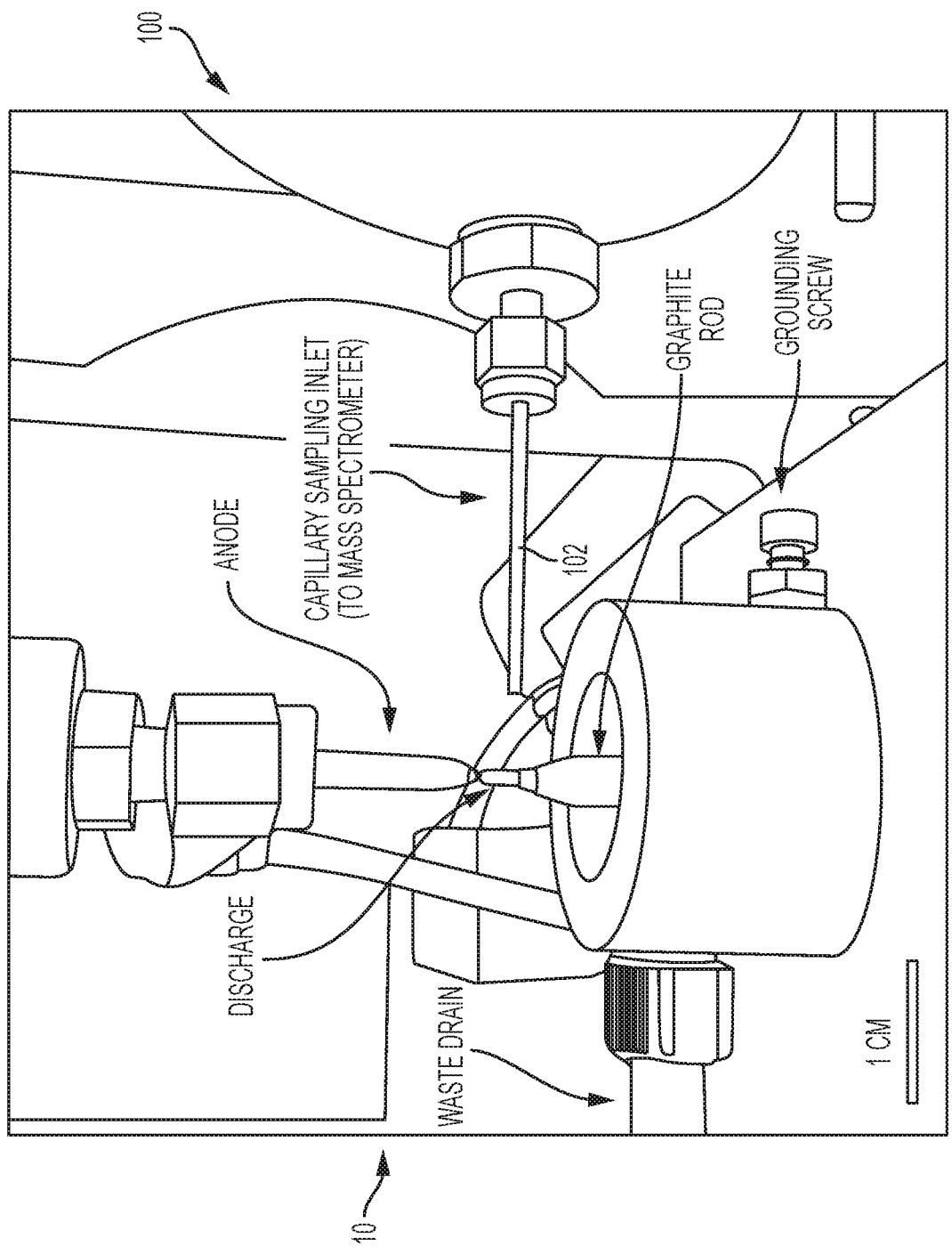
FIG. 2 is a photograph of an arrangement that includes a SCGD cell and a mass spectrometer that was used to sample ions from the SCGD.

Referring now to FIGS. 2 and 10, a mass spectrometer (MS) 100 having an inlet 102, such as an atmospheric-pressure inlet, is arranged adjacent to the SCGD cell 10 such that ions resulting from the SCGD cell 10 are detectable by the MS 100. It is contemplated that, in other embodiments, an ion mobility spectrometer could be arranged in a similar manner to the MS 100 relative to the SCGD cell 10. The distance 104 between the inlet 102 of the MS 100 and the plasma discharge 20 is about 0.2 cm to about 10 cm, about 0.2 cm to about 5 cm, about 0.2 cm to about 2 cm, about 0.2 cm to about 1 cm, about 0.2 cm to about 0.8 cm, about 0.2 cm to about 0.6 cm, about 0.3 cm to about 10 cm, about 0.3 cm to about 5 cm, about 0.3 cm to about 2 cm, about 0.3 cm to about 1 cm, about 0.3 cm to about 0.8 cm, about 0.3 cm to about 0.6 cm, about 0.3 cm to about 0.5 cm, about 0.5 cm, or about 0 cm. The inlet has an inner diameter of about 0.1 mm to about 1 mm, about 0.2 mm to about 1 mm, about 0.3 mm to about 1 mm, about 0.1 mm to about 0.8 mm, about 0.2 mm to about 0.8 mm, about 0.3 mm to about 0.8 mm, about 0.1 mm to about 0.7 mm, about 0.2 mm to about 0.7 mm, about 0.3 mm to about 0.7 mm, about 0.4 mm to about 0.7 mm, or about 0.5 mm to about 0.6 mm.

Referring again to FIG. 1, a conductive sample solution 50 (e.g., acid- or salt-containing water solution) enters the SCGD cell 10 through the capillary 30, which may be a vertically oriented glass capillary. The conductive sample solution 50 overflows from the tip 38 of the capillary 30 onto and making electrical contact with the cathode rod 32, which is held at electrical ground. The conductive sample solution 50 contains an electrolyte solute at a sufficient concentration such that the conductive sample solution 50 can electrically couple to the ground 18. Exemplary electrolyte solutes include nitric acid, sulfuric acid, sodium sulfite, and the like. The concentration of the electrolyte solute may be from about 0.05M to about 2M, 0.1M to about 2M, 0.05M to about 1M, 0.1M to about 1M, 0.05M to about 0.5M, 0.1M to about 0.5M, or preferably about 0.1M. As such, overflow of the conductive sample solution 50 onto the cathode rod 32 creates an electrical connection between the incoming conductive sample solution 50 and the ground 18. The conductive solution may also contain one or more surfactants to boost ion formation.

Figure 9:
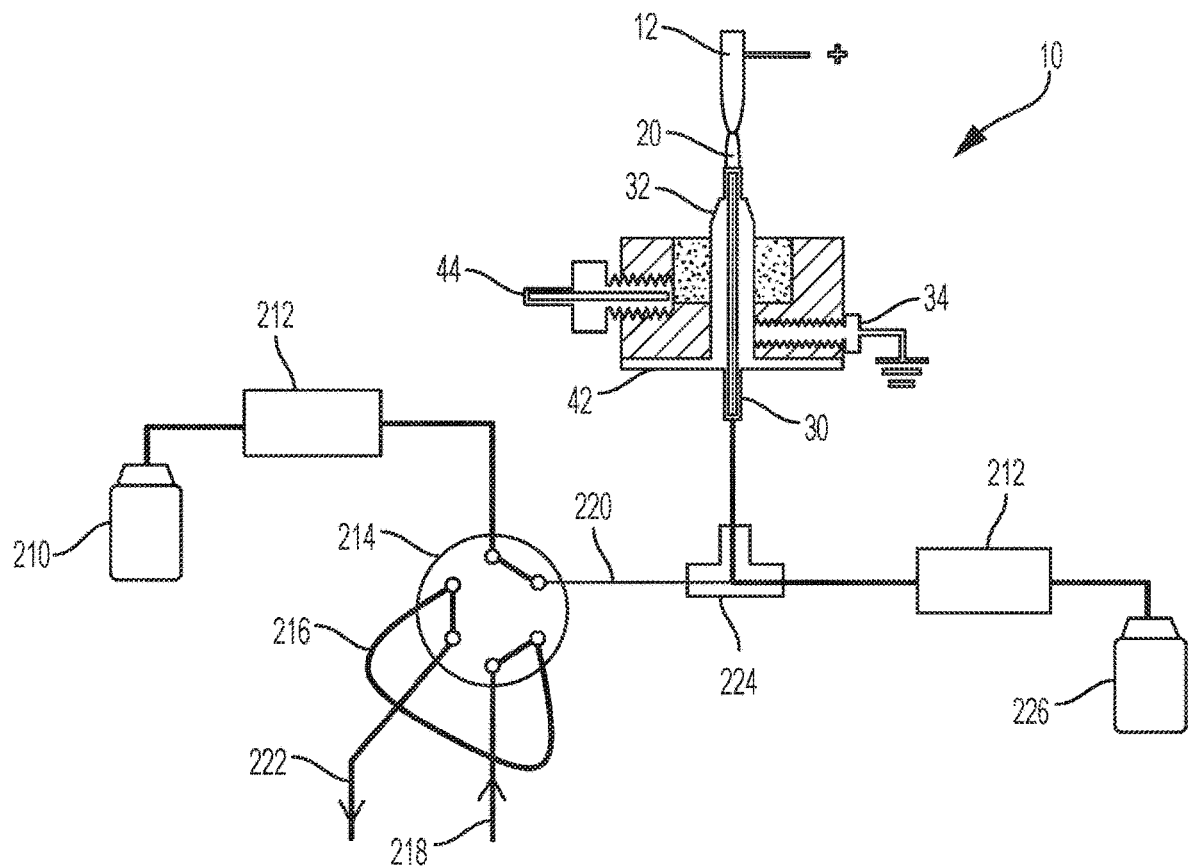
FIG. 9 is a schematic diagram of the SCGD of FIG. 1 in a flow-injection arrangement used to introduce solutions into the SCGD.

In some embodiments, the conductive sample solution 50 is introduced into the SCGD cell 10 via flow injection, as shown in FIG. 9. Here, a carrier stream of deionized water 210 is provided by a syringe pump 212 to an injection valve 214, outfitted with a sample loop 216. A sample is introduced into the carrier stream of deionized water 210 by way of a sample inlet 218 into the sample loop 216 of the injection valve 214. Some of the sample is taken up by the carrier stream and passes into a fused capillary 220, while the remaining sample exits the injection valve 214 through sample exit 222. The fused capillary 220 leads the carrier stream, which now includes deionized water 210 and sample, to a T-connector 224 and into the capillary 30 of the SCGD cell 10. A conductive solution 226 is transported by a pump 212 to the T-connector 224 for mixing with the carrier stream of deionized water 210 and sample, thus forming conductive sample solution 50.

The conductive sample solution 50 is introduced at a flow rate of about 0.01 mL/min to about 10 mL/min, about 0.1 mL/min to about 10 mL/min, about 0.5 mL/min to about 10 mL/min, about 1 mL/min to about 10 mL/min, about 0.01 mL/min to about 5 mL/min, about 0.1 mL/min to about 5 mL/min, about 0.5 mL/min to about 5 mL/min, about 1 mL/min to about 5 mL/min, about 0.01 mL/min to about 2.5 mL/min, about 0.1 mL/min to about 2.5 mL/min, about 0.5 mL/min to about 2.5 mL/min, about 1 mL/min to about 2.5 mL/min, or about 2 mL/min. The conductive solution 50 may further comprise one or more water-miscible organic solvents such as methanol or ethanol and may comprise one or more surfactants.

Still referring to FIG. 1, mounted directly above the capillary 30 is an anode rod 12, made of a conductive material such as tungsten. When a high potential, such as >700 V, is applied to the anode rod 12, electrical breakdown occurs in the ambient air between the anode rod 12 and the conductive sample solution 50. This breakdown results in the formation of a plasma discharge 20 that is sustained between the high-voltage anode rod 12 and the grounded conductive sample solution 50. To prevent the plasma discharge 20 from devolving into an electrical arc, a 1.25-kΩ ballast resistor 22 is placed between the high-voltage power supply 16 and the anode rod 12. Any conductive sample solution 50 that is not vaporized by the plasma discharge 20 drains into the non-conductive waste basin 42, made of a material such as polytetrafluoroethylene, where the overflow conductive sample solution 50 is removed through the drain 44.

The present disclosure also includes several applications of the methods and apparatuses described herein. In some embodiments, when the analyte is a biomolecule, such as a biopolymer, the present disclosure provides for rapid and easy determination of biomolecule identity and function, such as in proteomics. In further embodiments, the present disclosure provides for detection and definitive identification of illicit substances directly from solid-, solution-, or gaseous-phase samples. In still further embodiments, the present disclosure provides for measurement of diverse toxic species (e.g., heavy metals, polychlorinated biphenyls, pesticides, etc.) in solid, gaseous (e.g., in air pollution or DHS monitoring), or liquid environmental samples.

The present disclosure provides several advantages over spectrometry systems known in the prior art. The SCGD cell disclosed herein is a single and inexpensive device that can be interfaced with a commercial atmospheric-pressure inlet spectrometer and can ionize/detect intact molecules or controllably fragment molecules to provide structural information on the analyte species, which may be selected from molecules, ions, complexes, and the like. This approach reduces instrument cost and complexity, and supports structural characterization with a wider variety of instruments (e.g., single quadrupole, sector field, time-of-flight, etc.). The methods described herein allow controlled fragmentation of peptides within the ion source, at atmospheric pressure, without tandem MS for structural elucidation. By controlling certain SCGD parameters such as current and voltage, either intact molecular ions or fragment ions can be formed. These tunable "soft" and "hard" ionization modes each provide utility in analyte detection. Soft, intact-molecule ionization provides greater sensitivity and the ability to detect many different molecules directly in a multicomponent sample. Hard, fragmenting ionization provides structural information on the detected molecules, which ultimately may lead to definitive analyte identification. Moreover, the SCGD is capable of producing intact gas-phase ions of elemental or bound elemental species, small organic molecules, and large, fragile biological polymers (proteins, RNA, DNA, etc.).

Advantageously, small molecules and elemental species may be detected in solid or gaseous forms when held near the plasma. This mode of operation allows samples to be analyzed in real-time without any sample pre-treatment.

Example 1. General Procedure for Using SCGD-MS Instrumentation

In the following examples, the support solution was either hydrochloric or nitric acid, both at 0.1 M concentration in water and the flow rate into the discharge was approximately 2 mL/min. The discharge was operated in a current-controlled mode with currents between 35 mA and 95 mA and a gap of 2.5 mm between the tungsten anode rod and the solution cathode. Solution overflowed from the tip of the pipet onto an electrically grounded graphite rod positioned 3-mm below the tip of the glass capillary to create an electrical connection between the incoming sample solution and ground. Except where noted otherwise, the SCGD was operated in constant-current mode with a current of 70 mA.

Referring to FIG. 2, the experimental arrangement used for the SCGD-mass spectrometry experiments described herein is shown. Here, the SCGD cell was mounted on an x-y-z adjustment stage (not shown in the illustration), and positioned near the atmospheric-pressure inlet of a mass spectrometer. To protect the mass spectrometer interface from corrosion by acidic vapor and droplets produced by the plasma discharge, an extended capillary inlet was used to sample ions from the discharge into the reduced-pressure mass spectrometer. These ions were sorted by their mass-to-charge ratio and detected by the mass analyzer; in this case, a high-resolution Orbitrap mass spectrometer (Exactive Plus, Thermo Scientific, Bremen, Germany) was used.

Dissolved samples (i.e. sample solutions) were analyzed by introducing them into the SCGD in the flowing support liquid. Analyte-containing droplets were formed at the plasma-liquid interface and subsequently desolvated within and beyond the discharge. Solid and gaseous samples were directly analyzed by placing the sample near the air-supported discharge. Without being bound by theory, it is believed that the elevated temperature of the atmospheric-pressure glow discharge thermally desorbs solid analyte molecules with ionization occurring from chemical-ionization reagents created by the plasma itself or through interaction of the plasma products with the ambient atmosphere. It is also believed that aerosol droplets liberated from the sample solution likely release portions of solid samples or sample deposits and carry those portions into the discharge and into the spectrometer inlet.

Example 2. Chemicals and Reagents

All chemicals used for preparation of solution standards and for evaluation of ambient desorption/ionization were of reagent-grade (≥95% purity) or better. Water, methanol, and trifluoroacetic acid (TFA) used as solvents and additives were obtained from Fisher Scientific (Optima LC/MS grade). The modified peptide renin substrate I (97%) (Example 11), human angiotensin I (90%) (Example 12), human angiotensin II (93%) (Example 12), bradykinin (98%) (Example 13), substance P (95%) (Example 13), Met$^5$-enkephalin (95%) (Example 14), and [D-Ala$^2$, D-Leu$^5$]-enkephalin (95%) (Example 14) were all purchased as acetate salts from Sigma-Aldrich (St. Louis, Mo.). Biotinylated, phosphorylated SAMS peptide was obtained from Enzo Life Sciences (Farmingdale, N.Y.). Support solutions for the SCGD were prepared by dilution of concentrated, trace metal grade hydrochloric acid (J. T. Baker, Center Valley, Pa.) with deionized water of 18.2 MΩ resistivity, prepared in-house with a mixed-bed ion-exchange deionization unit. Molecular standards were prepared by serial dilution of a concentrated (0.1 M) stock solution with 0.1 M HCl diluent. Elemental standards were prepared by serial dilution in 0.1 M HNO$_3$ of a stock solution (1000 ppm, prepared from the nitrate salts of the respective elements). Diluents and SCGD support solutions (either 0.1 M HCl or HNO$_3$) were prepared by dilution of the respective trace-metal grade concentrated acid with water of 18.2 MΩ cm resistivity, prepared in-house with a mixed-bed ion-exchange deionization unit.

Example 3. SCGD Cell

The present study employed a compact SCGD cell as shown in FIG. 1. A support solution (0.2 M HCl with 6% methanol) was delivered by a Gilson Minipuls 3 peristaltic pump (Middletown, Wis.) at a rate of 1.70 mL min$^{-1}$ to a vertically oriented glass capillary (0.38-mm ID, 1.1-mm OD). This solution composition was chosen because it was found to produce the higher ion signals for peptides than did more typical SCGD support solutions (e.g. 0.1 M HCl). Sheathing the capillary was a graphite tube of 1.40-mm ID and 4.53-mm OD, tapered to a point, with a contact angle of 15°, nearest the tip of the glass inlet capillary. The graphite tube and capillary were mounted within a polytetrafluoroethylene (PTFE) basin of approximately 20-mL volume. A stainless-steel screw, mounted through the side of the basin, served to electrically ground the graphite tube. Liquid overflow from the tip of the capillary, positioned 3-mm above the top of graphite tube, created a connection between electrical ground and the incoming liquid cathode. Mounted directly above the glass capillary was a tungsten rod (3.18-mm diameter, 25.42-mm length) which served as the anode for the discharge. The tip closest to the solution-inlet capillary was tapered at a contact angle of 15° to provide a pointed structure that resulted in a more stable discharge. When a high potential (≥1000 V) was applied to the tungsten rod from a direct-current power supply (Kepco, Flushing, N.Y., BHK 2000-0.1 MG), electrical breakdown occurred in the ambient air between the rod and the solution. This resulted in the formation of a plasma that was sustained between the high-voltage anode and grounded solution cathode. To prevent the plasma from devolving into an electrical arc, a 1.25-kΩ ballast resistor was inserted between the high-voltage power supply and anode. Any solution that was not vaporized by the plasma drained into the PTFE basin, from which it was removed through a waste outlet. The discharge was operated in constant-current mode, with currents ranging from 35 to 90 mA. A 5-mm inter-electrode gap (distance between the tungsten rod and grounded solution) was used for all experiments.

Example 4. SCGD Mass Spectrometer Instrumentation

Two mass spectrometers were coupled to the SCGD to acquire elemental, fragmentation, and intact molecular data. The first was a Thermo LTQ XL linear ion trap (Thermo Scientific, San Jose, Calif.), which is capable of multiple stages of tandem mass spectrometry ($MS^n$). The standard ionization source housing was removed and the SCGD was positioned near the mass-spectrometer inlet. Optimum mass-spectral performance was obtained with the inlet capillary at 15 V and 275° C., and the tube lens at 65 V. Mass spectra were acquired with automatic gain control (AGC) enabled, a maximum injection time of 100 ms, and hardware averaging of 2 microscans. For elemental species, it was beneficial, but not necessary, to break apart solvated ions with an atmospheric-pressure inlet collision-induced dissociation (a.k.a. "source fragmentation") of 40 V. The second instrument used was a high-resolution Thermo Exactive Plus (Thermo Scientific, Bremen, Germany) based on the Orbitrap mass analyzer. Optimum signals were obtained with the inlet capillary at 0 V and 320° C. and an S-lens level of 50% and 100% for low-mass and high-mass species, respectively. Spectra were acquired with a maximum injection time of 200 ms and only one microscan. Except where stated otherwise, mass spectra shown represent the average produced from a 9.4-s integration, corresponding to 10 scans.

Example 5. Sample Introduction and Ion Sampling

Peptide solutions were introduced into the SCGD via flow injection, as shown in FIG. 9. Here, a carrier stream of 50 µL $min^{-1}$ deionized water (18.2-MΩ specific resistance) was provided by a syringe pump (Model Fusion 100T, Chemyx, Inc., Stafford, Tex.) to a Rheodyne 6-port injection valve (Model MXT715-000, Oak Harbor, Wash.), outfitted with a 5-µL sample loop. Sample solutions exiting the valve passed into a fused-silica capillary (50-µm ID, 150-µm OD). Fed through a T-connector and into the inlet capillary of the SCGD cell, the fused-silica capillary was terminated 1-mm below the surface of the support solution overflow. This nested-capillary arrangement prevented sample injections from mixing with the support flow until the very tip of the SCGD inlet capillary, and thereby reduced void volume and dilution experienced by sample injections.

In the case of each mass spectrometer, the standard inlet capillary, between the open air and reduced-pressure mass analyzer, was replaced with a home-built extended inlet capillary (~1.6 mm o.d., ~570 µm i.d.) to be able to properly sample ions from the discharge. This custom capillary extended about 40 mm from the instrument.

The capillary was heated to 320° C. with the instrument's standard inlet heater and controlled/monitored through the instrument-control software. The use of thermal insulation around the exposed part of the capillary was found to have no impact on mass spectra or ion signals and, as such, was not used for these studies. In addition, no gas flow, apart from the vacuum pull within the first stage of the MS, was used to direct ions from the SCGD to the inlet. For all experiments, the stainless-steel capillary was positioned 3 to 6 mm below the SCGD plasma, at a distance of 3 to 5 mm from the SCGD sample inlet capillary.

Mass spectra in the Examples represent the background-subtracted average (approximately 10 scans) of the mass-spectral signal acquired over a single flow-injection peak for a given peptide.

Example 6. Conventional Ionization and Fragmentation

Some peptides analyzed with SCGD-MS were also subjected to more conventional ionization and fragmentation approaches on two different mass spectrometers. In both cases, solutions containing 1 µg/mL of each peptide were dissolved in HPLC-MS grade water. Flow injection of a 5-µL plug of peptide solution was carried to a heated ESI source (HESI II probe, Thermo Scientific, San Jose, Calif.) with 50 µL/min carrier flow of 50% methanol, 25% water, and 0.1% TFA. The carrier solvent flow was delivered by a binary liquid chromatograph pump (model HPG-3400RS, Thermo Scientific, San Jose, Calif.) after passing through a vacuum degasser (model SRD-3600, Thermo Scientific, San Jose, Calif.).

Low-resolution ESI tandem mass spectra were acquired with a Thermo Scientific LTQ XL linear ion trap (San Jose, Calif.). The source was operated at 4 kV with a sheath gas flow rate and gas-heater temperature of 20 (manufacturer's units) and 50° C., respectively, to cope with the relatively high liquid flow rates. Spectra were collected in automatic gain-control mode with a maximum ion-trap injection time of 100 ms and 1 microscan per spectrum. The experimental parameters for positive-ion detection were: capillary temperature 310° C.; capillary voltage 20 V; tube lens 85 V. Tandem mass spectrometry ($MS^n$) was performed via collision-induced dissociation (CID) after isolation of either the $MH_2^{2+}$ of $MH_3^{3+}$ ion. These tandem mass spectra were obtained with an isolation window of 1.5 Th and 20% relative collision energy.

High-resolution ESI mass spectra were acquired with an Exactive Plus Orbitrap mass spectrometer (Thermo Scientific, Bremen, Germany) Fragmentation of all ions (i.e. without isolation) was performed through in-source collision-induced dissociation with energies between 20 and 40 eV. The in-source CID occurs within the vacuum system of the mass spectrometer through a DC voltage offset between the entrance ion optics and the transfer optics. All spectra were recorded with a mass resolving power setting of 140,000 and an automatic gain control (AGC) target value of $1\times10^6$ ions. To ensure high mass accuracy, better than 1 ppm, the instrument was mass calibrated daily and a lock mass of m/z 371.10124, due to polysiloxane, was used throughout.

Example 7. Uranyl ($UO_2^{2+}$) Solution

Figure 3A:
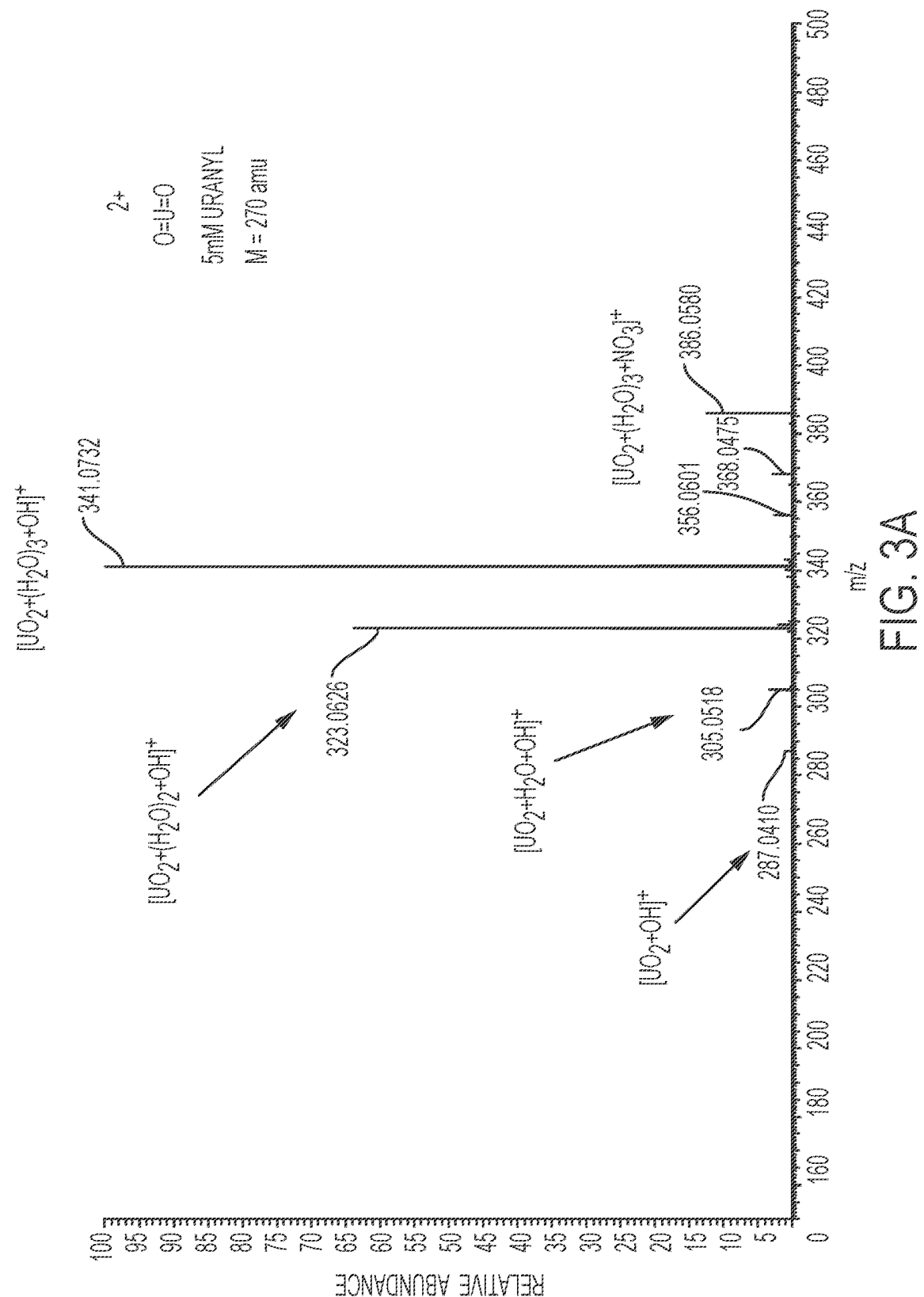
FIG. 3A is a mass spectrum of a 5 mM uranyl ($UO_2^{2+}$) solution containing 0.1M nitric acid produced using the mass spectrometer and SCGD of FIG. 2.

The ability to detect elemental species with SCGD-MS is demonstrated in FIG. 3. In this case, solutions of uranyl ($UO_2^{2+}$) in nitric acid were introduced into the SCGD as the support liquid. The mass spectrum in FIG. 3A is the determination of 5-mM uranyl in nitric acid. A hydroxide ($OH^-$) adduct on the doubly charged uranyl cation produced the singly charged species detected at m/z 287.041. In addition to this primary ion, sequential additions (or adducts) of water onto this uranyl hydroxide species were also readily detected. The SCGD is known to produce some large (>10 μm-diameter) droplets of aqueous solution, and heavily hydrated ions were detected. A second set of ions was observed at higher m/z-values, which correspond to a nitrate ($NO_3^-$) adducted on the uranyl cation and its hydrated forms.

Figure 3B:
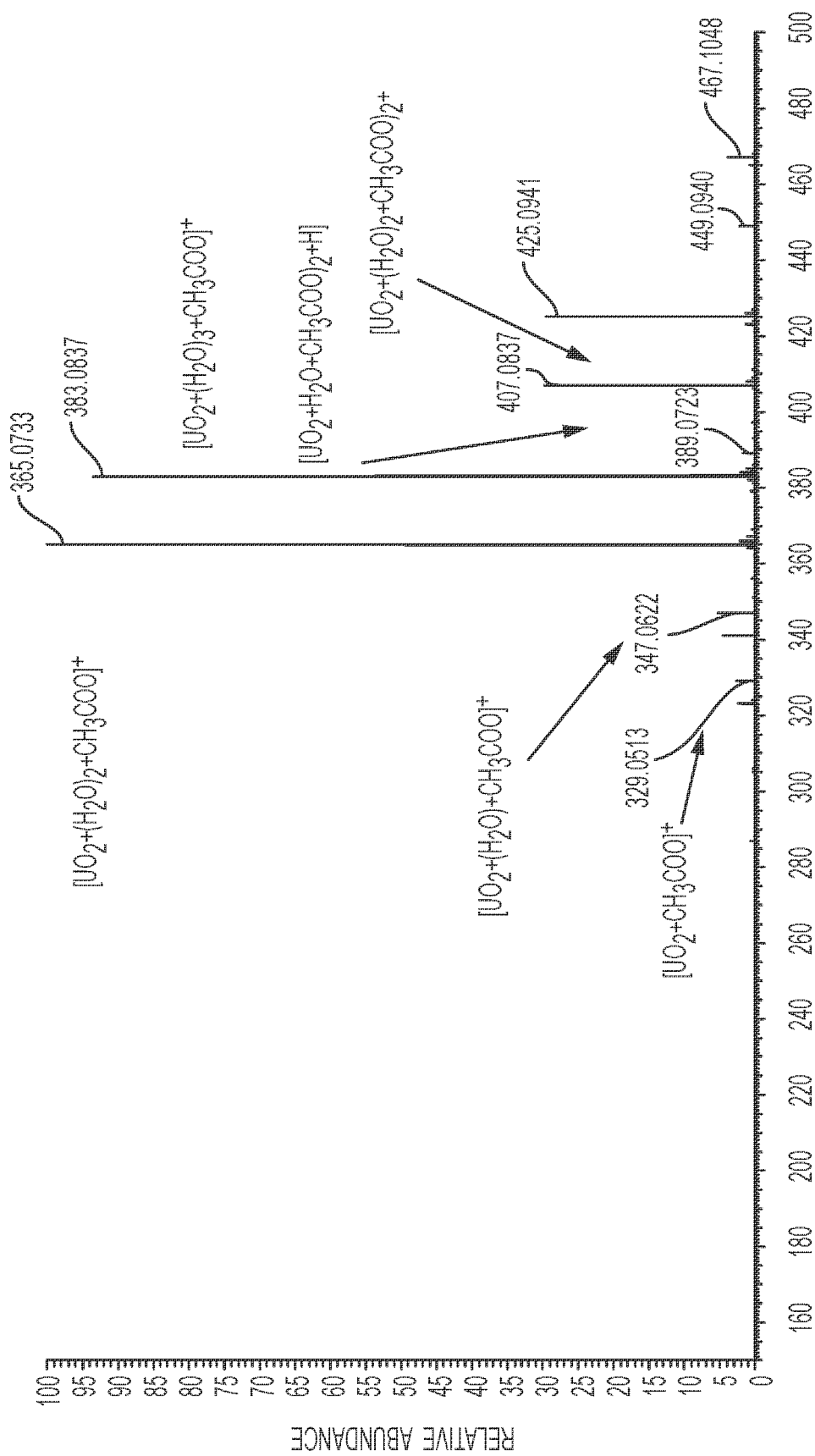
FIG. 3B is a mass spectrum of a 5 mM uranyl ($UO_2^{2+}$) solution containing 0.1M nitric acid and 2% acetic acid produced using the mass spectrometer and SCGD of FIG. 2.

When 2% acetic acid was added to the uranyl solution, the spectrum exhibited a noticeable shift to higher masses (cf. FIG. 3B). The difference is due to the presence of acetate ($CH_3COO^-$) anions bound to the uranyl cation. This finding is particularly interesting since the type of uranyl species in solution is highly dependent on pH, especially in the presence of acetic acid, which indicates that this source could also be useful for chemical speciation (i.e. determining the chemical form(s) of an element in a sample).

Example 8. Solid Caffeine

Figure 5:
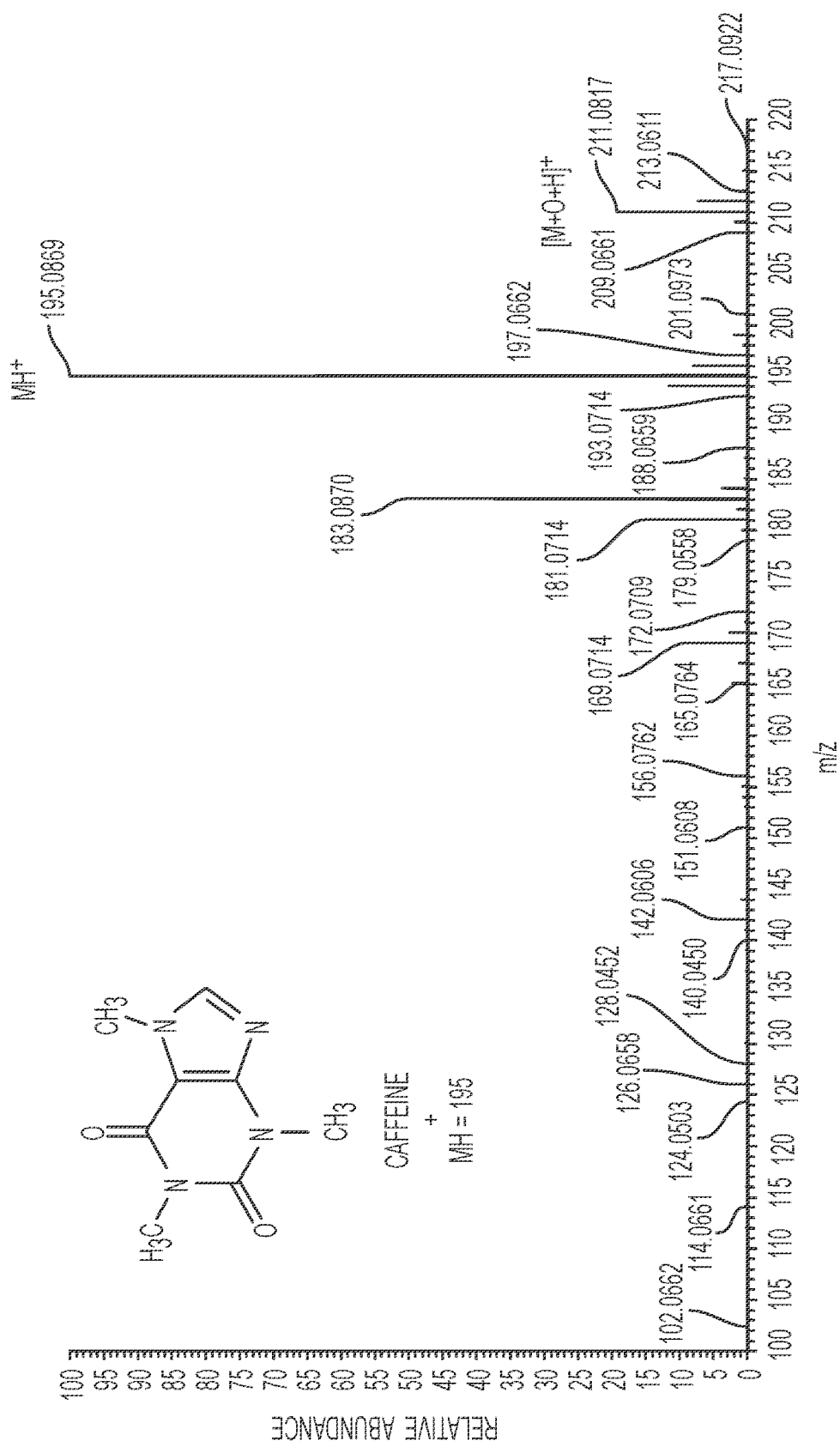
FIG. 5 is a mass spectrum of a solid caffeine sample on a glass probe using the mass spectrometer and SCGD of FIG. 2.

It was also found that ions from molecular species could be detected from solid samples (cf. FIG. 5). Here, a glass probe with solid caffeine on it was held between the SCGD and the inlet of the mass spectrometer. The support liquid flow of the SCGD contained only nitric acid and water. Almost instantly, the $MH^+$ ion of caffeine at m/z 195.087 was detected. Without being bound by theory, one possible explanation is that the high gas temperature of the SCGD is sufficient to heat the probe and sample, leading to thermal desorption of caffeine from the probe. It is also believed that aerosol droplets liberated from the sample solution likely release caffeine and carry it into the discharge and into the spectrometer inlet. Gas-phase caffeine molecules are subsequently protonated with reagent ions, such as $H_3O^+$ and $(H_2O)_2H^+$, produced by the SCGD or through its interaction with atmospheric constituents.

Example 9. Solid Biphenyl

Figure 6:
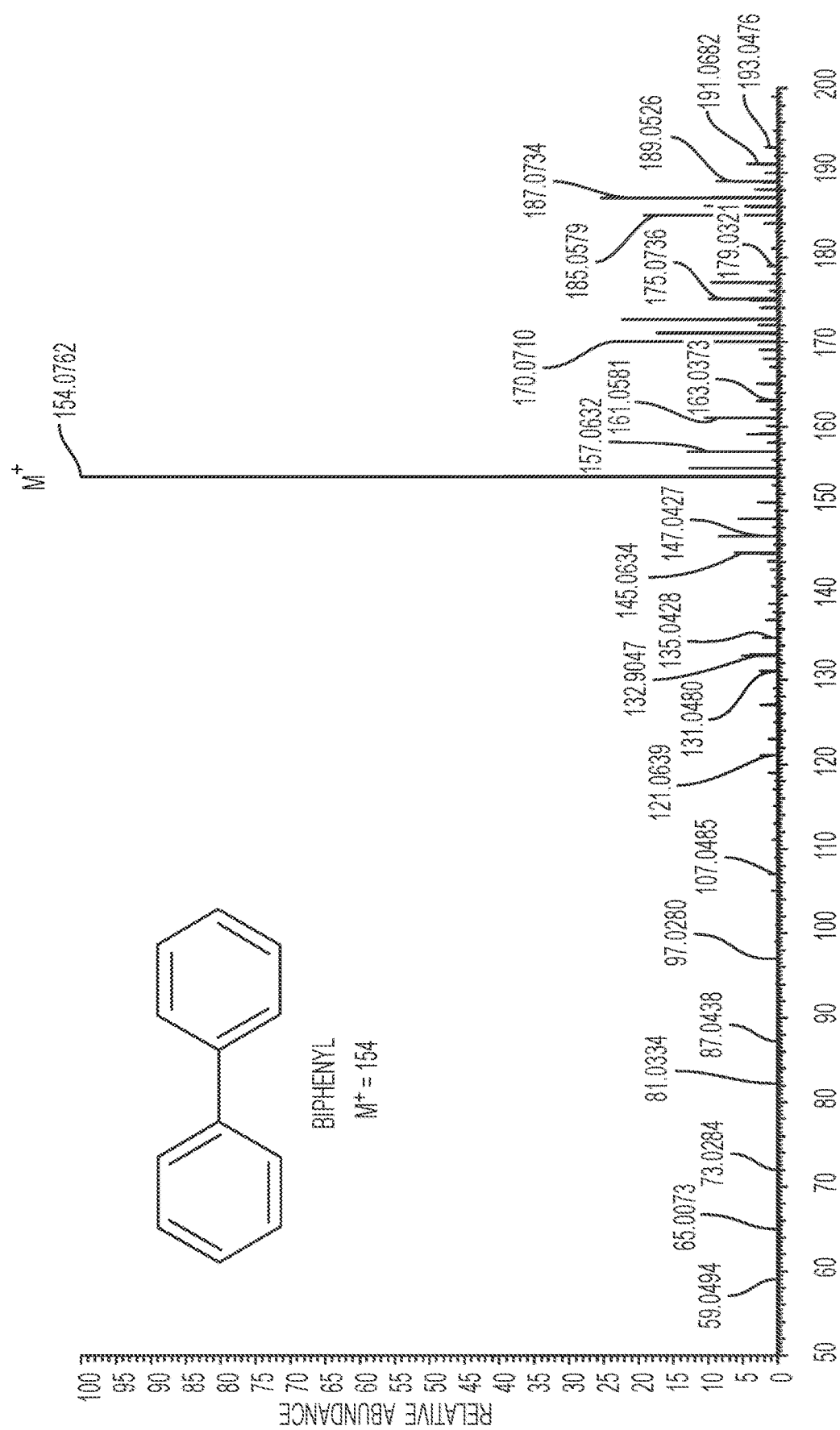
FIG. 6 is a mass spectrum of a solid biphenyl sample on a glass probe using the mass spectrometer and SCGD of FIG. 2.

FIG. 6 shows the mass spectrum of the highly non-polar molecule biphenyl ($C_{12}H_{10}$) held near the SCGD on a glass probe. The radical molecular cation ($M^+\cdot$) at m/z 154.076 was the dominant species. Charge-transfer reagent ions, such as $O_2^+$ and $NO^+$, were probably responsible for ionization of biphenyl, indicating that the SCGD produces a diverse range of reagent ions that are available for chemical ionization. The present findings show the flexibility of the SCGD as an ionization source for mass spectrometry.

Example 10. 2,4,6-Trichloroanisole

Figure 7:
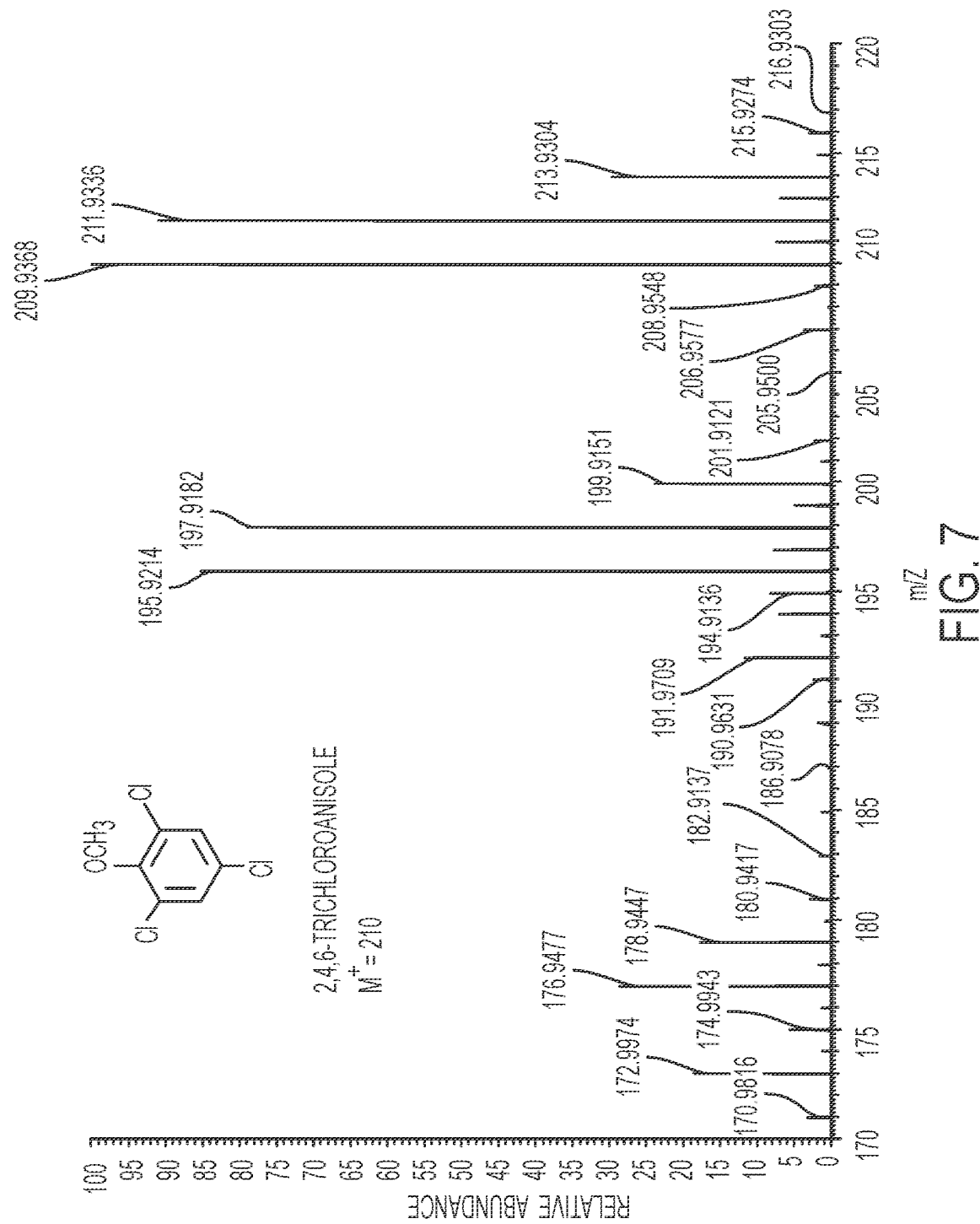
FIG. 7 is a mass spectrum of a solid 2,4,6-trichloroanisole sample on a glass probe using the mass spectrometer and SCGD of FIG. 2.

FIG. 7 shows the mass spectrum of solid 2,4,6-trichloroanisole held near the SCGD on a glass probe. The radical molecular cation ($M^+\cdot$) at m/z 209.937 was the dominant species.

Example 11. Renin Substrate I

Figure 8A:
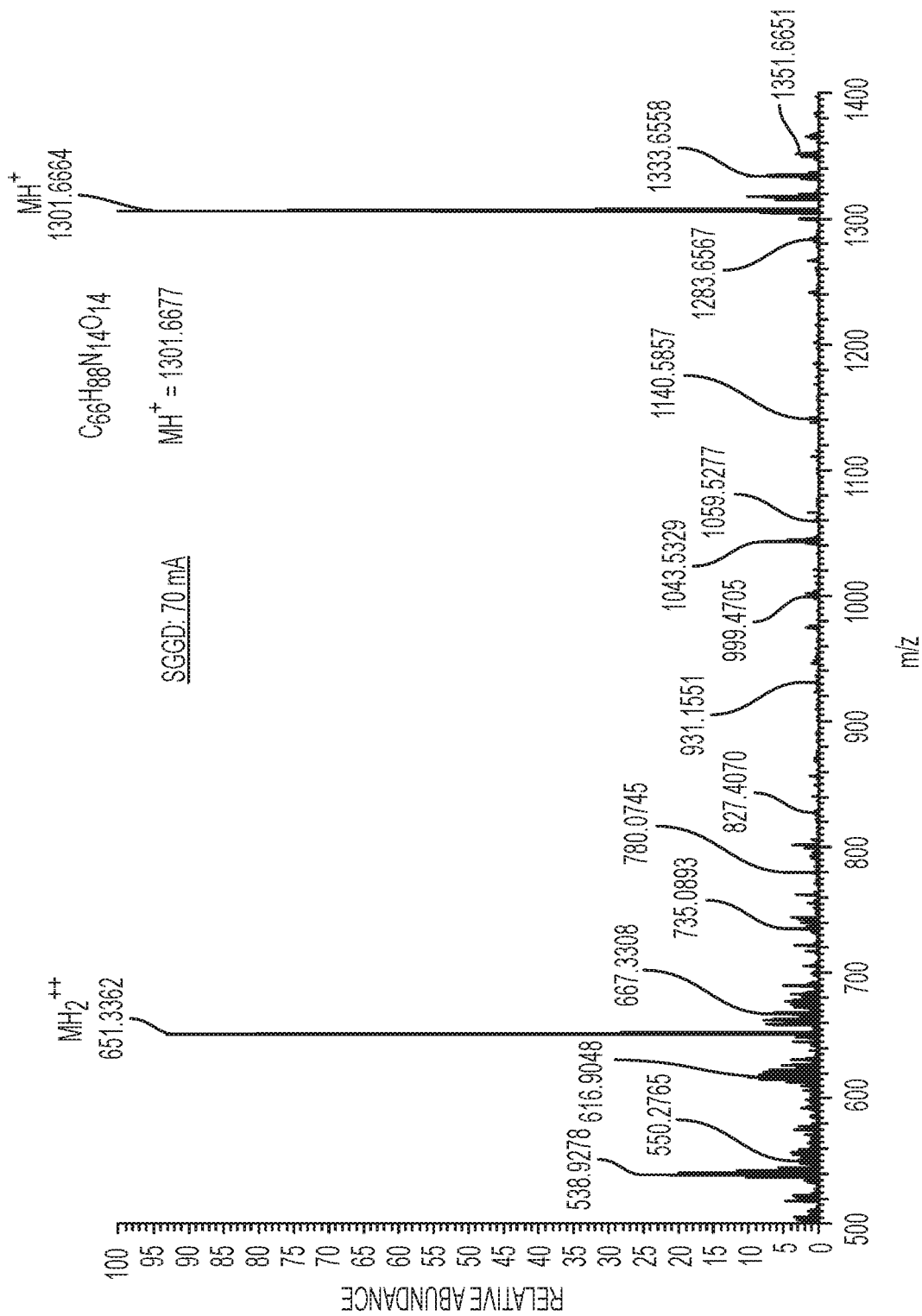
FIG. 8A is a mass spectrum of a modified peptide renin substrate introduced by flow-injection analysis into a 0.2M hydrochloric acid solution produced using the mass spectrometer and SCGD of FIG. 2 at 70 mA.

The SCGD was used as a biomolecular ionization source with the modified peptide renin substrate I, which contains an N-terminal succinylation (Suc) and a C-terminal aminomethyl coumarin (AMC). This peptide has the sequence Suc-RPFHLLVY-AMC and a molecular weight (MW) of 1300.485 Da. FIG. 8A shows the mass spectrum of renin substrate I obtained with the SCGD; the discharge was operated at 70 mA. In this mode, both the protonated and doubly protonated molecular ions ($MH^+$ and $MH^{2+}$, respectively) were readily detected. Without being bound by theory, presence of the doubly charged molecular ion suggests that an electrospray-like ionization process was occurring.

Figure 8B:
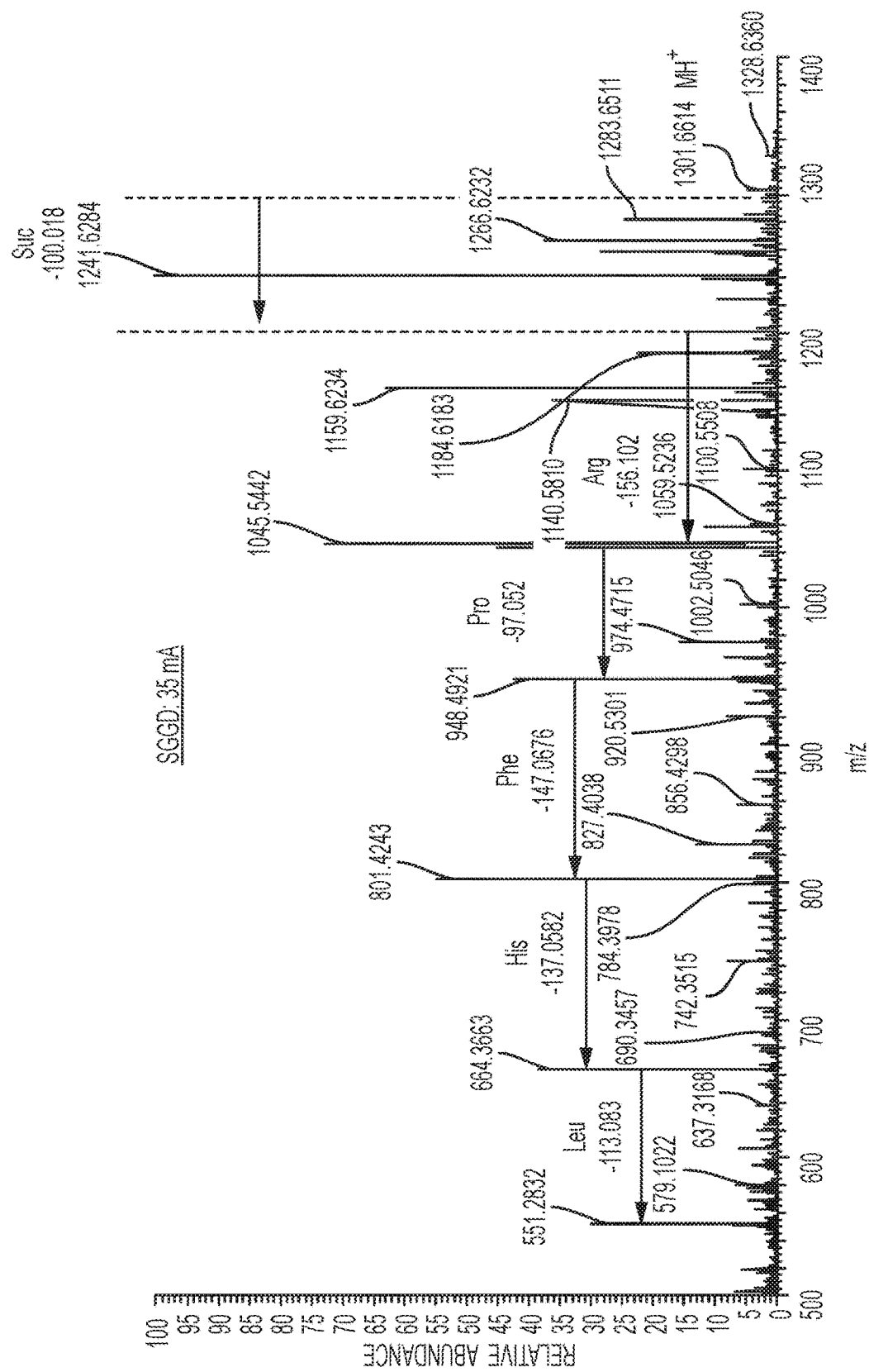
FIG. 8B is a mass spectrum of a modified peptide renin substrate introduced by flow-injection analysis into a 0.2M hydrochloric acid solution produced using the mass spectrometer and SCGD of FIG. 2 at 35 mA.

In a subsequent study, the SCGD current was dropped to 35 mA. At this lower current, the spectrum was dramatically different, as shown in FIG. 8B; the doubly protonated ion was no longer detected and the protonated molecular ion appeared at rather low abundance. Instead, the spectrum was dominated by a number of ions of lower m/z. Examination of the mass differences among these lighter ions reveals successive losses of the C-terminal succinyl modification and amino-acid residues along the peptide chain. Surprisingly, despite the presence of a basic amino acid (arginine) at the N-terminus of renin substrate I, the most abundant fragment ions consisted of singly charged, C-terminal, y-type ions, while the more thermodynamically favored N-terminal b-ions occur at significantly lower abundance. Finally, $d_{a5}^+$ and $d_{a7}^+$ ions were also present in the SCGD spectrum of renin substrate I. The d-type fragments, resulting from partial side-chain fragmentation of $a_n$ ions, are typically produced only with high-energy CID or vacuum-ultraviolent photodissociation (UV-PD). These secondary d-type fragments may be useful for distinguishing between the isomeric amino acids leucine and isoleucine. In the case of renin substrate I, if isoleucine were instead present at position five, the observed $d_{a5}^+$ ion would appear at m/z 694.355 and be accompanied by a $d_{b5}^+$ fragment at m/z 708.370. In the SCGD mass spectrum primarily one ion type was dominant and there were no doubly charged fragments that complicate interpretation.

Figure 11A:
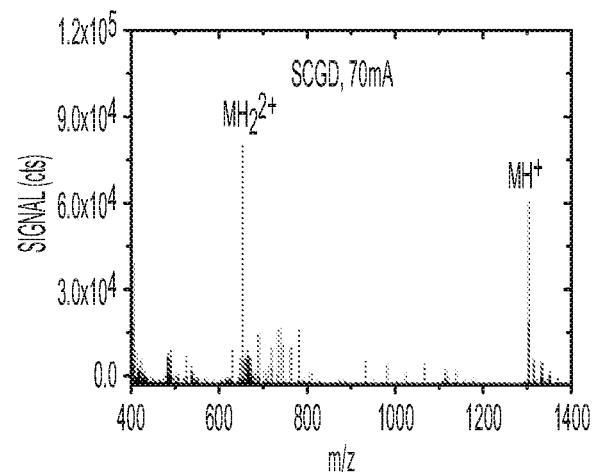
FIG. 11A is a mass spectrum of a peptide renin substrate I (Suc-RPFHLLVY-AMC) produced using traditional ESI with first-stage CID.
Figure 11B:
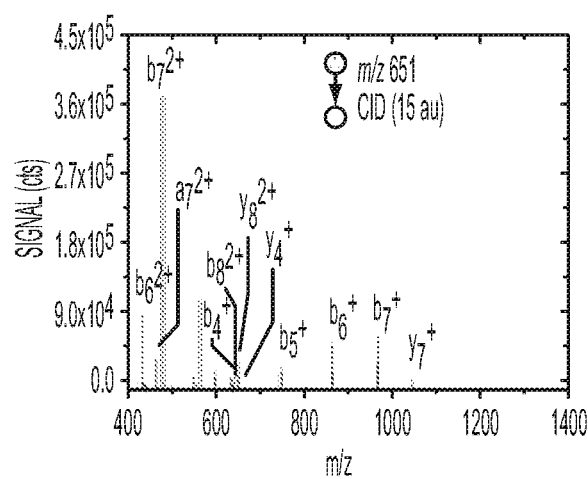
FIG. 11B is a mass spectrum of a peptide renin substrate I (Suc-RPFHLLVY-AMC) produced using CID in a linear ion trap.

The SCGD-MS spectra were compared to spectra a conventional ESI source with either first-stage CID or CID performed within a linear ion trap, as shown in FIGS. 11C and 11D, respectively. The ESI-MS/MS spectra exhibited a combination of both singly and doubly charged b-, y-, and a-type ions.

Example 12. Angiotensin

Figure 12B:
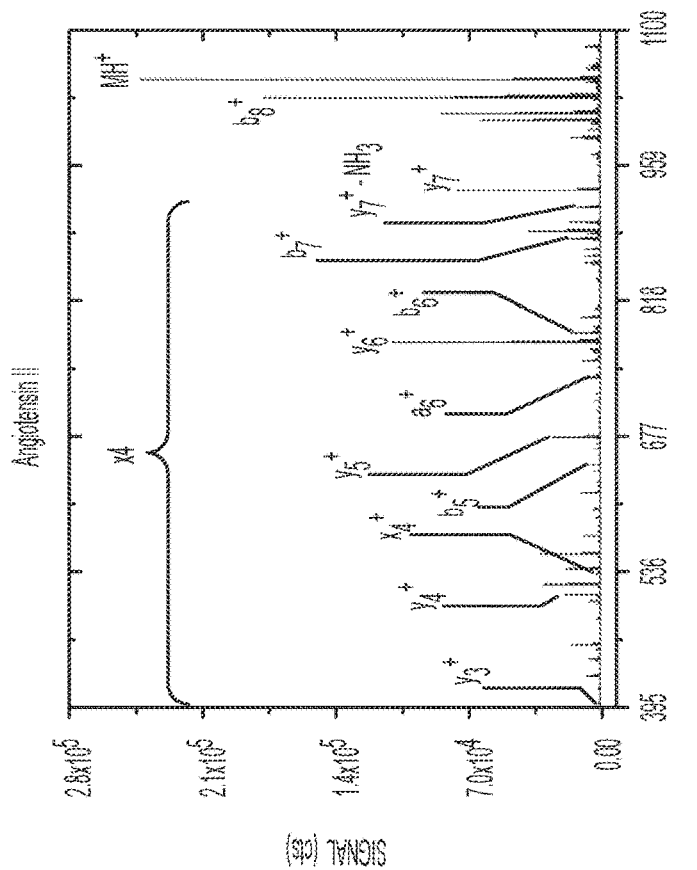
FIG. 12B is a mass spectrum of angiotensin II (DRVY-IHPF) produced using the mass spectrometer and SCGD of FIG. 9 at 48 mA.
Figure 12A:
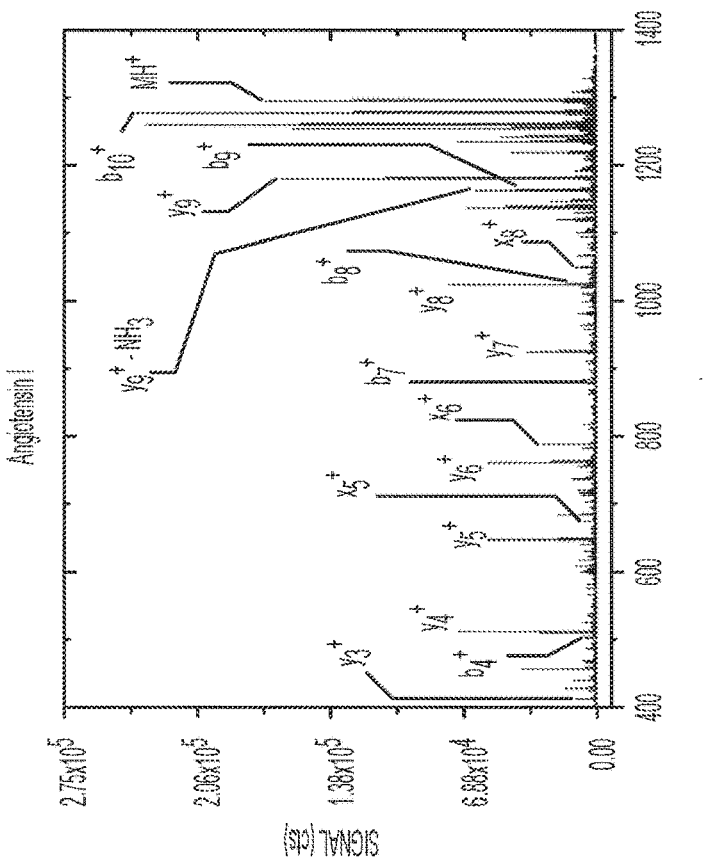
FIG. 12A is a mass spectrum of angiotensin I (DRVYIH-PFHL) produced using the mass spectrometer and SCGD of FIG. 9 at 48 mA.

Relatively simple fragmentation patterns were observed also for the peptides angiotensin I (DRVYIHPFHL, MW 1297.486 Da) and angiotensin II (DRVYIHPF, MW 1047.189 Da), shown in FIGS. 12A and 12B, respectively. Each spectrum represents the average signal from 5-μL injections of 1.9 and 2.5 nmol of angiotensin I and II, respectively. For easier viewing, the vertical axis of the angiotensin II spectrum is expanded by a factor of four in the m/z range of 395-900.

Like renin substrate I, both angiotensin peptides exhibited a simple fragmentation spectrum with the C-terminal y-ions at highest abundance, though b-, x-, and a-type ions were also detected. Though not explicitly labeled in FIG. 12A due to their low relative abundance, $d_{a6}^+$ and $d_{b6}^+$ fragments, corresponding to the loss of either side chain from the doubly substituted beta carbon of isoleucine, were apparent in the spectrum of angiotensin I. This finding further demonstrates that SCGD-MS provides a means of differentiation between isomeric residues.

Example 13. Bradykinin and Substance P

Figures 13A, 13B:
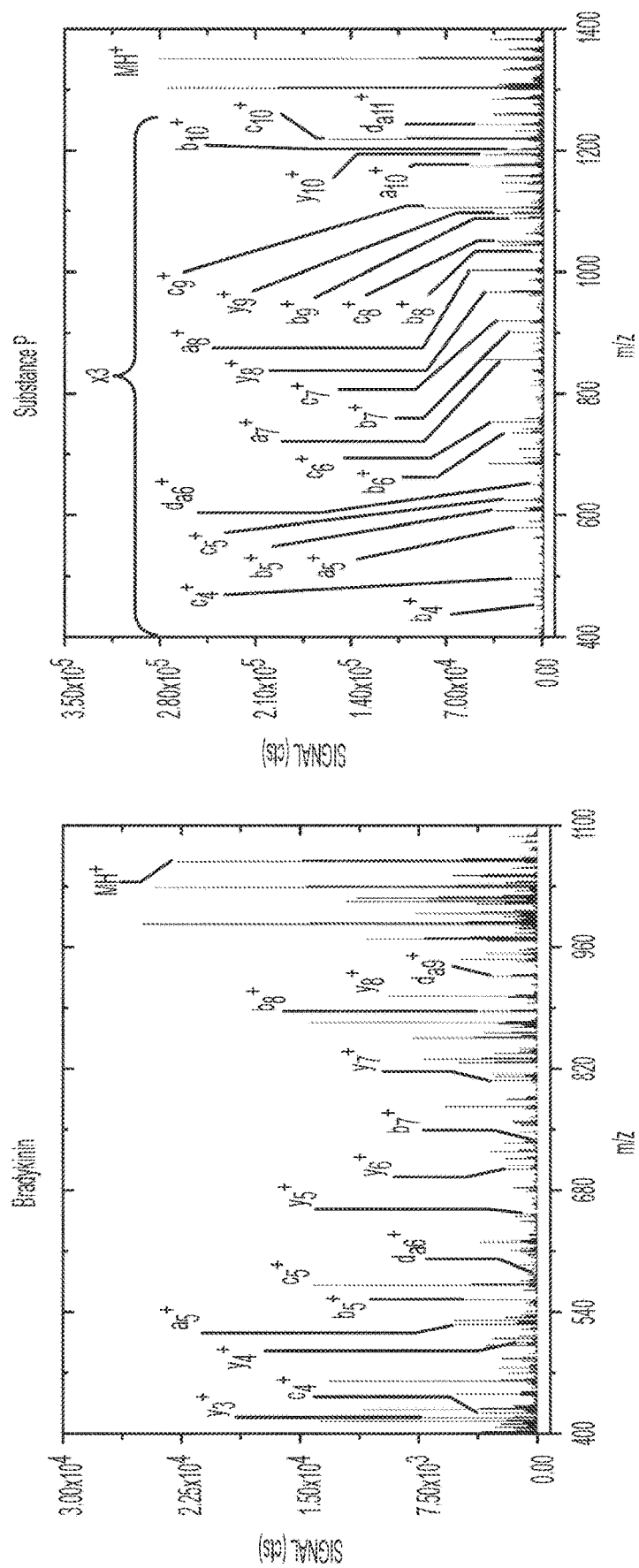
FIG. 13A is a mass spectrum of bradykinin (RPPGF-SPFR) and substance P (RPKPQQFFGLM) produced using the mass spectrometer and SCGD of FIG. 9 at 55 mA.
FIG. 13B is a mass spectrum of substance P (RPK-PQQFFGLM) produced using the mass spectrometer and SCGD of FIG. 9 at 55 mA.

FIG. 13A shows the SCGD spectrum of the peptide bradykinin (RPPGFSPFR, MW 1061.218 Da). The spectrum is the average produced by 5-μL injections of 2.4 of bradykinin. In contrast to the spectra presented earlier, SCGD fragmentation of bradykinin yielded y-, b-, a-, c-, and d-type ions, with no one ion type of dominant abundance. Substance P (RPKPQQFFGLM, MW 1349.624 Da), commonly used as a benchmark test for new fragmentation techniques, exhibited a complex fragmentation spectrum, as shown in FIG. 13B. The spectrum is the average produced by 5-μL injections of 1.9 nmol of substance P. For easier viewing, the vertical axis of the substance P spectrum is expanded by a factor of three in the m/z range of 400-1250. When fragmented by the SCGD, substance P generates an extensive series of a-, b-, c- and d-type ions.

Example 14. Enkephalin

Figure 14B:
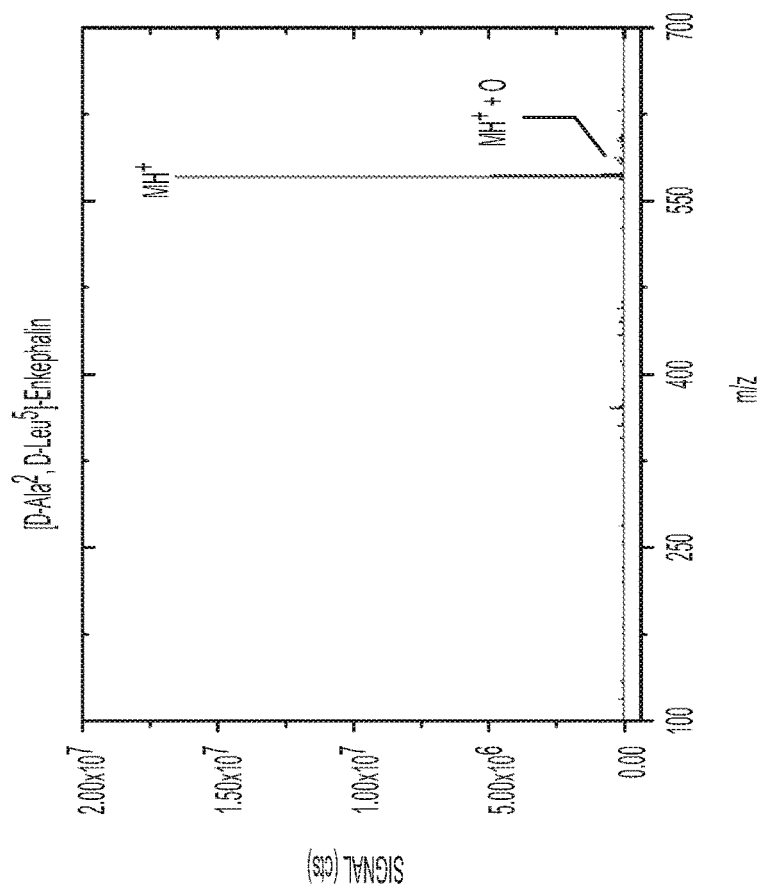
FIG. 14B is a mass spectrum of [D-Ala-2, D-Leu-5]-enkephalin (TAGFL) produced using the mass spectrometer and SCGD of FIG. 9 at 55 mA.
Figure 14A:
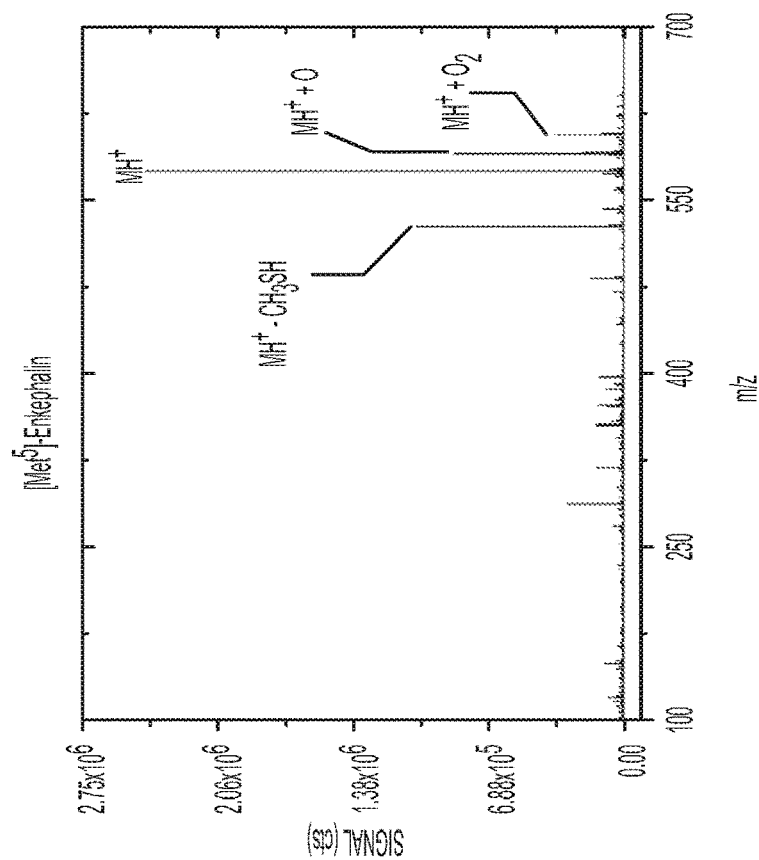
FIG. 14A is a mass spectrum of Met-5 enkephalin (YG-GFM) produced using the mass spectrometer and SCGD of FIG. 9 at 55 mA.

The spectrum of Met-5 enkephalin (YGGFM, MW 574.670 Da) is shown in FIG. 14A, which was dominated by the protonated molecular ion (MH$^+$), oxygen adducts (MH$^+$+O and MH$^+$+O$_2$), and a single fragment corresponding to the loss of a methanethiol group ([M−CH$_3$SH]H$^+$) from the methionine residue. The peptide [D-Ala-2, D-Leu-5]-enkephalin (YA$^D$GFL$^D$, MW 570.658 Da) is shown in FIG. 14B, with mainly the protonated molecular ion and a single oxygen adduct (MH$^+$ and MH$^+$+O, respectively) apparent. Spectra are the average produced from a 5-μL injection of 4.4 nmol peptide. In contrast to methionine enkephalin, the entire y-ion series as well as some a- and b-ions were detected for the substituted leucine enkephalin (not shown on the figure).

Example 15. Biotinylated, Phosphorylated SAMS Peptide

Figures 15A, 15B:
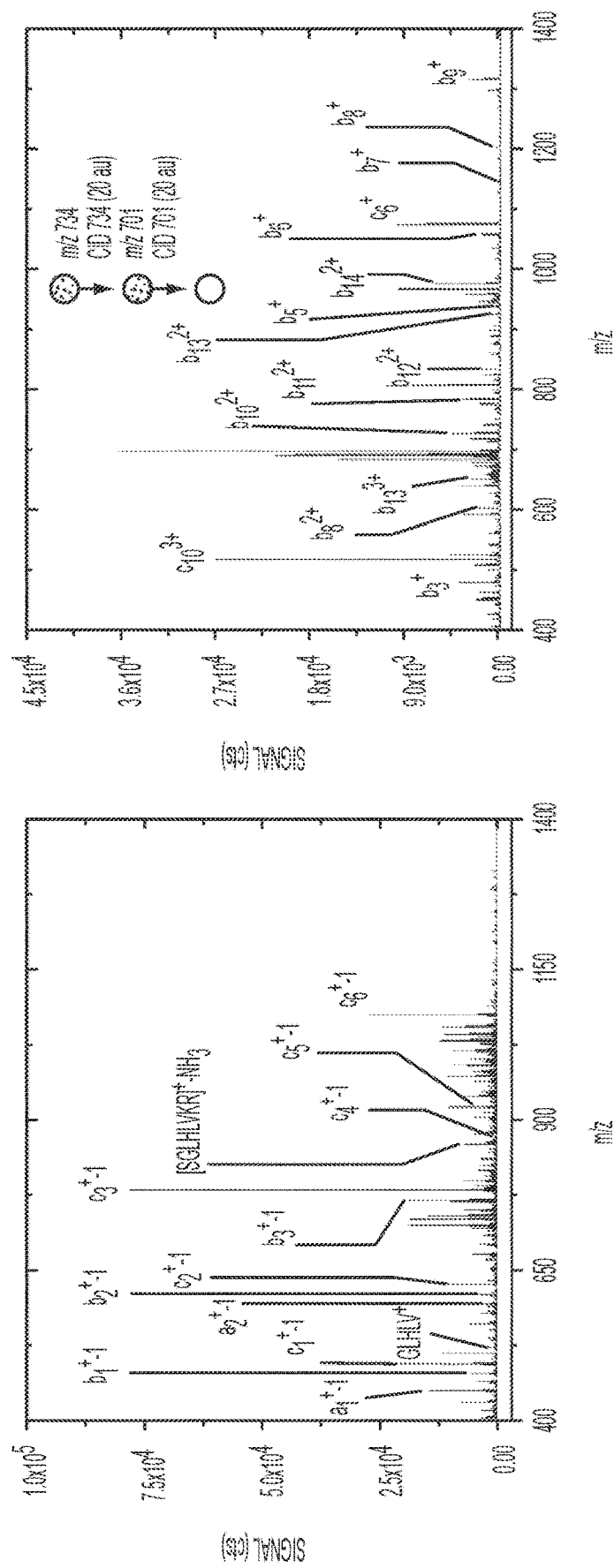
FIG. 15A is a mass spectrum of biotinylated, phosphorylated SAMS peptide produced using the mass spectrometer and SCGD of FIG. 9 at 55 mA.
FIG. 15B is a mass spectrum of biotinylated, phosphorylated SAMS peptide (biotin-HMRSAMpSGLHLVKRR) produced using ESI-$MS^3$.
Figure 16A:
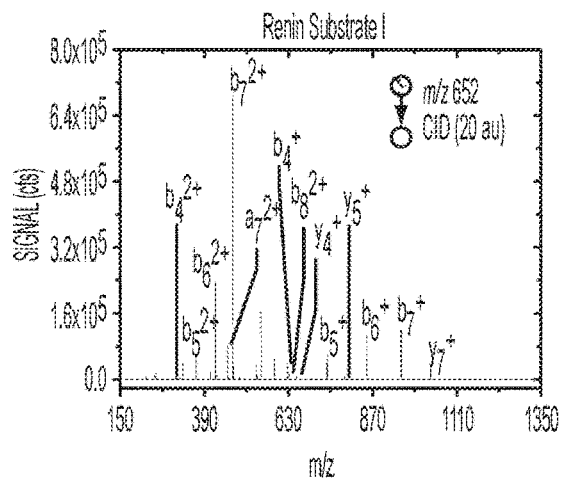
FIG. 16A is a MS/MS spectrum of peptide renin substrate I produced using ESI-CID.
Figure 16B:
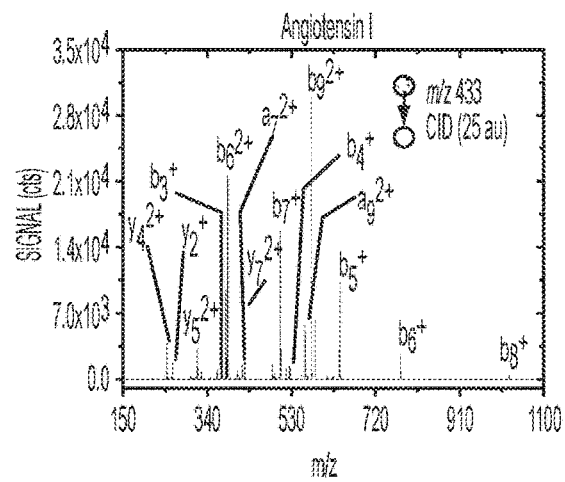
FIG. 16B is a MS/MS spectrum of angiotensin I produced using ESI-CID.
Figure 16C:
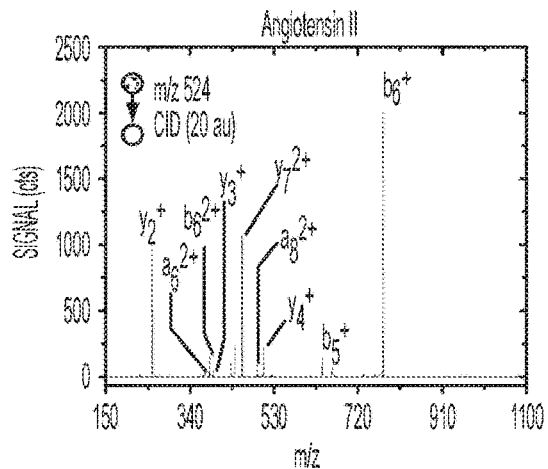
FIG. 16C is a MS/MS spectrum of angiotensin II produced using ESI-CID.
Figure 16D:
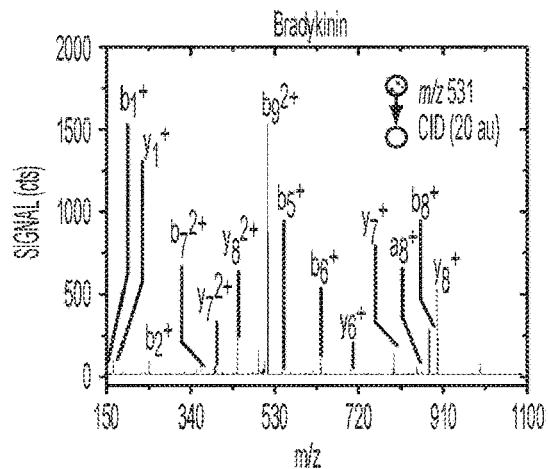
FIG. 16D is a MS/MS spectrum of bradykinin produced using ESI-CID.
Figure 16E:
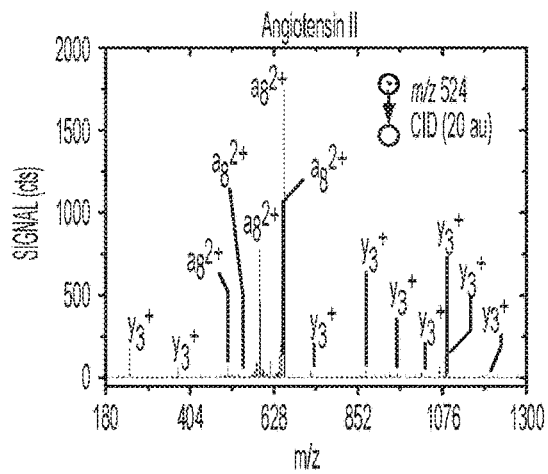
FIG. 16E is a MS/MS spectrum of substance P produced using ESI-CID.
Figure 16F:
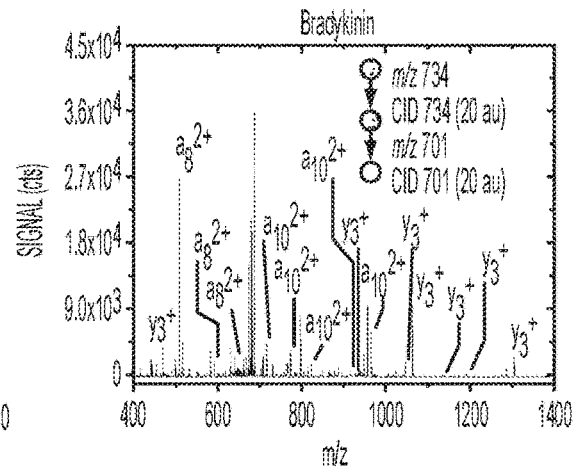
FIG. 16F is a MS/MS spectrum of biotinylated, phosphorylated SAMS peptide produced using ESI-CID.

Biotinylated (as 6-biotinylamino-hexanoic acid), phosphorylated SAMS peptide (biotin-HMRSAMpSGL-HLVKRR, MW 2200.597) was analyzed. As shown in FIG. 15A, SAMS peptide exhibited extensive fragmentation in the SCGD. The protonated molecular ion was not observed at low currents. Instead, internal fragments, such as GLHLV$^+$ and SGLHLVKR$^+$ with a loss of NH$_3$, and several a-, b-, and c-type ions (with a loss of a single m/z unit) appeared. All the (a−1), (b−1), and (c−1) ions maintain the N-terminal biotin modification. Since no fragment ions were observed beyond (c$_6$−1)$^+$ in the SCGD spectrum, it was difficult to determine if phosphorylation is maintained.

For comparison, an ESI-MS$^n$ spectrum of the same modified SAMS peptide was acquired on a linear ion-trap MS, as shown in FIG. 15B. To obtain fragmentation comparable to the SCGD, two sequential CID activation steps were used. Activation of the triply charged molecular ion (MH$_3^{3+}$) produced only the loss of phosphoric acid (H$_3$PO$_4$), common in CID of phosphorylated peptides. Subsequent activation resulted in incomplete b- and c-ion series, all retaining the N-terminal biotin, of multiple charge states (+1-+3). In contrast, the SCGD provided fragmentation that is easier to interpret as all internal fragments and a-, b-, and c-type ions were singly charged, at signal levels higher than those afforded by multiple stages of CID, and without the use of a tandem-in-time instrument (i.e. an ion trap MS). Each spectrum represents the average ion signal from a 5-μL injection of 1.1 nmol of SAMS peptide.

Example 16. ESI-CID Spectra

MS/MS spectra of renin substrate I, angiotensin I, angiotensin II, bradykinin, substance P, and biotinylated, phosphorylated SAMS peptide were obtained with ESI-CID, as shown in FIGS. 16A-F, respectively. For each peptide, the target parent ion was the doubly protonated, doubly charged molecular ion, except in the case of angiotensin I and biotinylated, phosphorylated SAMS peptide, where the triply protonated, triply charged precursor was selected.

Example 17. Summary

Table 1 summarizes the identified fragments formed in the SCGD, including those not labeled in FIGS. 11-16, and also shows the sequence coverage for each peptide as determined from the fragment ions. Compared to the coverage offered by ESI-MS with CID, also shown in Table 1, the SCGD provided superior coverage for all peptides except biotinylated, phosphorylated SAMS and the enkephalin peptides, though the former peptide necessitated multiple isolation and CID-activation steps. When only a single stage of CID was used, SAMS peptide exhibited only the loss of phosphate and no sequence information was obtained for CID.

TABLE 1

Fragment ions from various peptides upon dissociation within the SCGD. Only fragments with m/z ≥150 are included. Sequence coverage of the SCGD, compared to ESI-MS/MS with CID, is also shown.

| Name, # Residues | Peptide Sequence | $a_n$ | $b_n$ | $c_n$ | $x_n$ | $y_n$ | $d_n$ | Internal Fragments | Identified Residues SCGD | Identified Residues ESI-MS/MS |
|---|---|---|---|---|---|---|---|---|---|---|
| Renin Substrate I, 8 | Suc-RPFHLLVY-AMC | — | 2-8 | — | — | 1-8 | a5, a7 | — | 8/8, 100% | 4/8, 50% |
| Angiotensin I, 10 | DRVYIHPFHL | — | 4, 7-10 | — | 5, 8 | 2-10 | a6, b6 | — | 10/10, 100% | 3/10, 30% |
| Angiotensin II, 8 | DRVYIHPF | 6 | 5-8 | — | 4 | 3-8 | — | — | 8/8, 100% | 2/8, 25% |
| Bradykinin, 9 | RPPGFSPFR | 5 | 5, 7-9 | 4, 5 | — | 2-9 | a6, a9 | — | 9/9, 100% | 3/9, 33% |
| Substance P, 11 | RPKPQQFFGLM | 5, 7, 8, 10 | 3-11 | 4-10 | — | 8-11 | a6, a11 | — | 11/11, 100% | 6/11, 55% |
| SAMS Peptide, 15 | biotin-HMR SAMpSGLHLVKRR | 1, 2 | 1-3 | 1-6 | — | — | — | GLHLV$^+$, [SGLHLVKR]$^+$-NH$_3$ | 6/15, 40% | 9/15, 60%[†] |
| [D-Ala-2, D-Leu-5]-enkephalin, 5 | YA$^D$GFL$^D$ | 4-5 | 3-5 | — | — | 2-5 | — | — | 5/5, 100%[‡] | 5/5, 100% |
| Met-enkephalin, 5 | YGGFL | — | — | — | — | — | — | [M-CH$_3$SH]H$^+$ | 0/5, 0% | 5/5, 100% |

[†]Sequence coverage achieved only through MS$^3$ as MS/MS produced exclusively [M−H$_3$PO$_4$ + H$_3$]$^{3+}$
[‡]Detected fragment ions were all less than 1% abundance relative to the protonated molecular on of the peptide

Example 18. Detection Limits

Limits of detection (LODs) for elemental species were determined from the formula:

$$LOD = \frac{3\sigma}{\bar{x}} \quad (1)$$

where σ represents the background noise (in counts, cts) and $\bar{x}$ the sensitivity (cts ppb$^{-1}$) determined from the linear region of the working curve of an element. Background noise was estimated from a calibration standard near the detection limit; in this case 0.5 or 1 ppb. Though this method, commonly employed in MS instruments where there is little-to-no chemical noise, enables detection limits to be estimated in the absence of background signal, the "true" limits of detection are likely better than those calculated due to the influence of multiplicative noise sources. Noise was measured as the standard deviation produced from 15 measurements of the elemental signal, where each measurement was a 9.4-s integration (average of 10 mass-spectral scans). Elemental signals were taken as the sum of the peak areas of all isotopes from a given element. Precision (as relative standard deviation, RSD) was determined from the average and standard deviation of the signal produced from five consecutive 9.4-s integrations of the peak area of the analyte at 1000-ppb concentration. Detection limits for elemental species ranged from 0.1 to 4 ppb, working curves spanned more than 4 orders of linear dynamic range, and precision varied between 5 and 16% relative standard deviation.

Example 19. Reagent and Background Ions

Figure 17A:
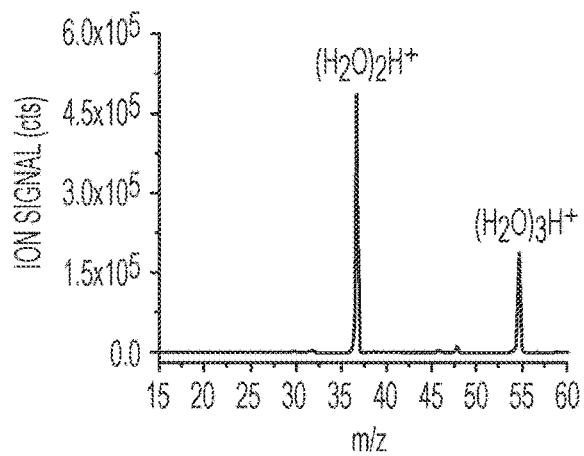
FIG. 17A is a mass spectrum of a blank 0.1 M $HNO_3$ support solution produced using the mass spectrometer and SCGD of FIG. 9.
Figure 17B:
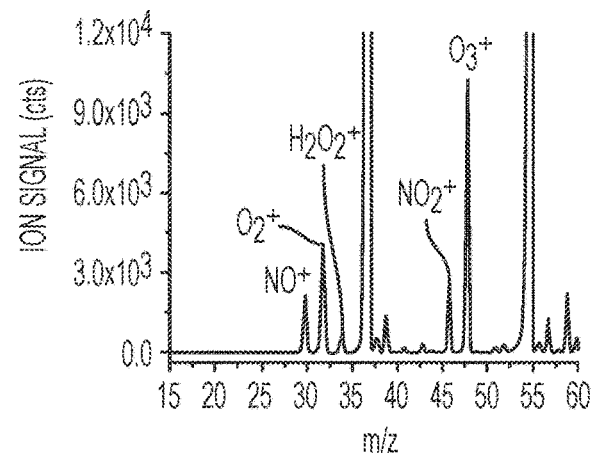
FIG. 17B is an expansion of the y-axis of the mass spectrum of FIG. 17A.

FIG. 17A shows an SCGD mass spectrum obtained during introduction of a blank 0.1 M HNO$_3$ support solution. Under the conditions utilized here, the low-mass range was dominated by lower-order protonated water clusters (H$_2$O)$_2$H$^+$ and (H$_2$O)$_3$H$^+$. Expansion of the y-axis in FIG. 17A reveals a variety of other reagent ions, as shown in FIG. 17B. Though at lower relative abundance than the water clusters, NO$^+$, H$_2$O$_2^+$, O$_2^+$, NO$_2^+$, and O$_3^+$ were also present in the mass spectrum.

Figure 17C:
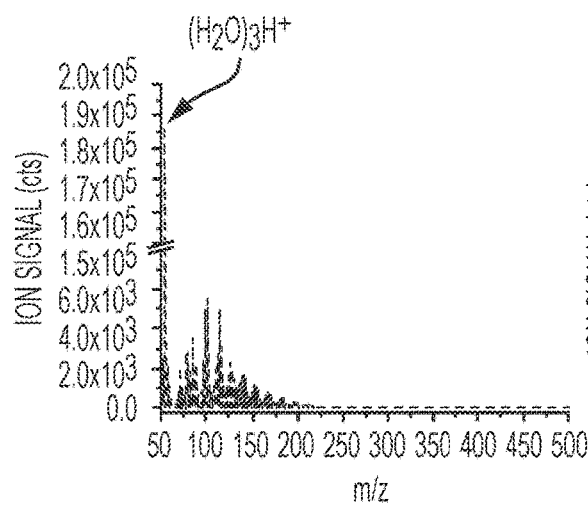
FIG. 17C is a positive-ion background of the mass spectrum of FIG. 17A.

Background ions produced by the SCGD were evaluated in the m/z range of 50-500, as shown in FIG. 17C. Though weak in comparison to the signal of (H$_2$O)$_3$H$^+$ a significant and structured background was observed over the range of 50-250 m/z.

Figure 17D:
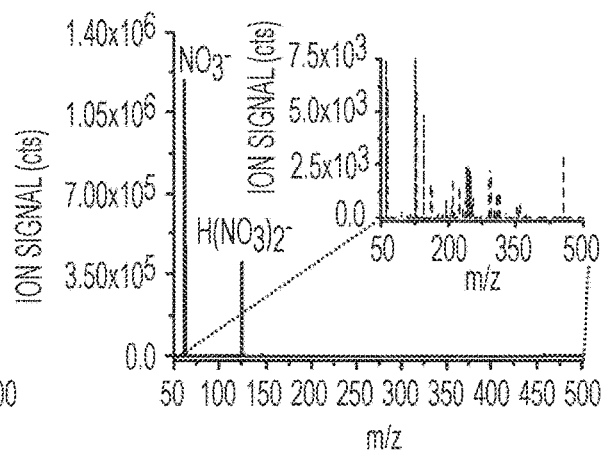
FIG. 17D is a negative-ion background of the mass spectrum of FIG. 17A.

In contrast to the complex positive-ion background, the negative-ion background of the SCGD was relatively simple. As shown in FIG. 17D, this background consisted only of nitrate ions (NO$_3^-$) and a proton-bound nitrate dimer (H(NO$_3$)$_2^-$). Expansion of the y-axis (inset trace in FIG. 17D) revealed additional ions, though at far lower levels (<0.5% abundance) than NO$_3^-$. The presence of strong signals from the negative reagent ion NO$_3^-$ suggests that the SCGD might be useful for molecular analysis in the negative-ion mode.

Example 20. Elemental Analysis

Figure 18A:
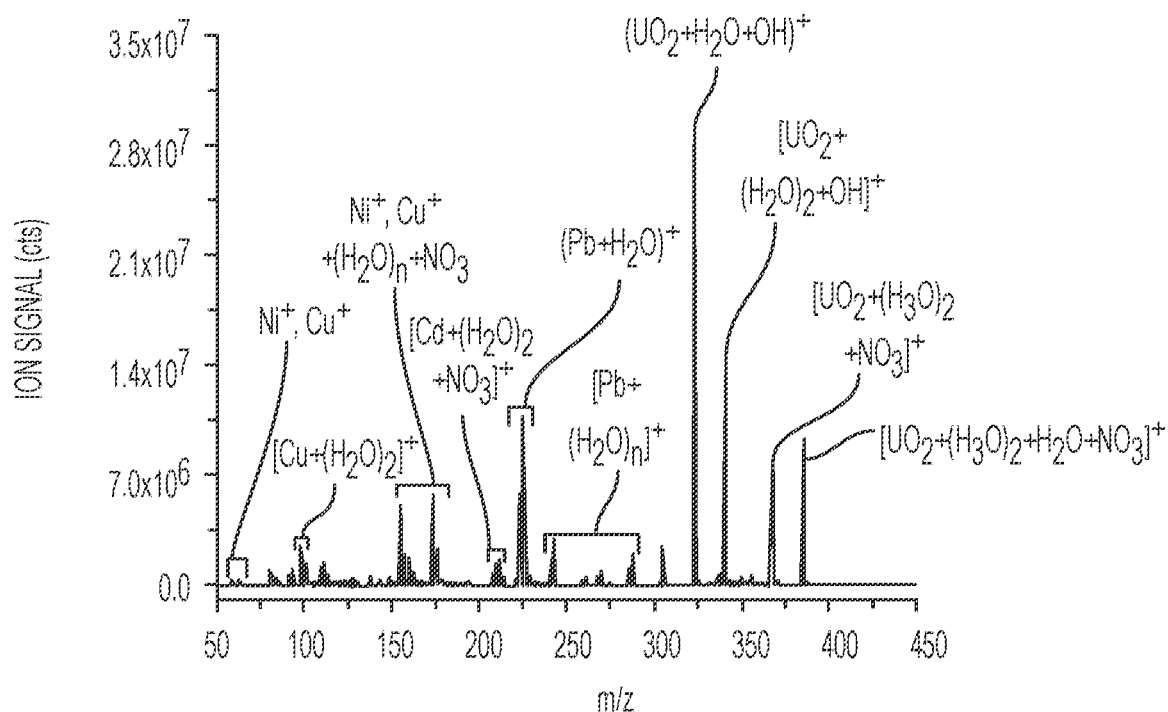
FIG. 18A is a mass spectrum of a solution of 1-ppm Cd, Cu, Ni, Pb and U in 0.1 M $HNO_3$ produced using the mass spectrometer and SCGD of FIG. 9 without first-stage collision-induced dissociation.

The ability to detect metal-containing species with SCGD-MS is demonstrated in FIG. 18A, which shows the mass spectrum from a solution of 1-ppm Cd, Cu, Ni, Pb, and U (as UO$_2$)$^+$ in 0.1 M HNO$_3$ introduced into the SCGD. From this solution, the SCGD produced both bare elemental ions and a variety of elemental ions bound with one or more adducts. The most common adduct was the addition of one or more water molecules to an elemental ion, though adducts of O, NO$_3^-$, and OH$^-$ are also present.

Figure 18B:
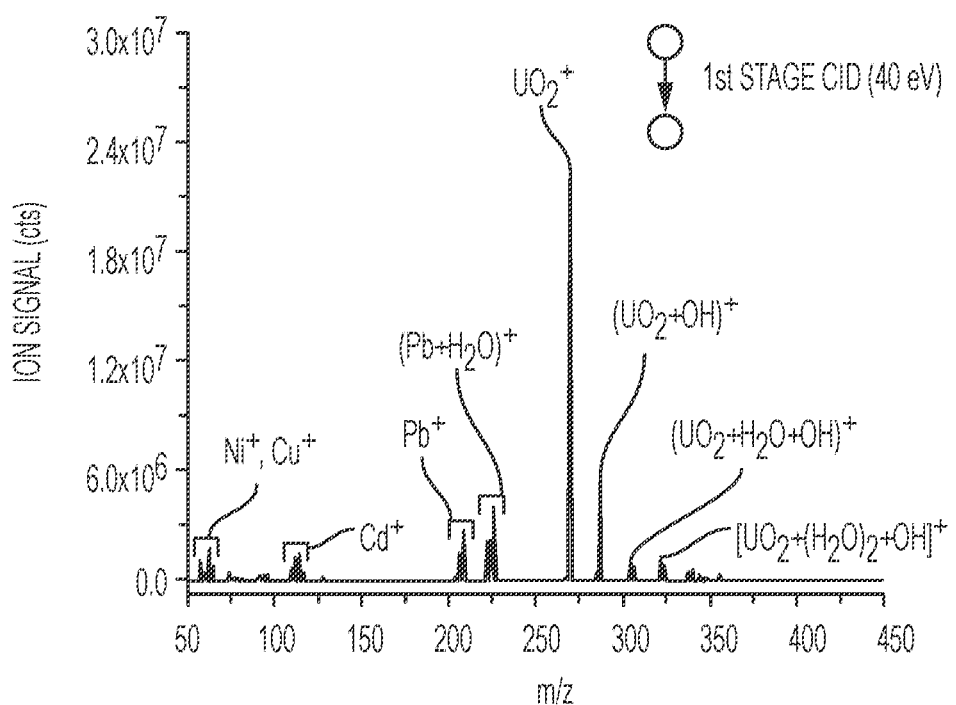
FIG. 18B is a mass spectrum of a solution of 1-ppm Cd, Cu, Ni, Pb and U in 0.1 M $HNO_3$ produced using the mass spectrometer and SCGD of FIG. 9 with first-stage collision-induced dissociation.

In-source collision-induced dissociation (CID) was explored as a means to reduce the clusters and adducts in the SCGD mass spectrum, as shown in FIG. 18B. Here, a moderate potential (40 V) was applied between optics within the first stage of the mass spectrometer, which resulted in acceleration of all ions and more energetic collisions between ion pairs and with residual atmospheric gases. Conversion of the translational energy into vibrational energy resulted in dissociation of weaker chemical bonds. In the case of ions produced by the SCGD, in-source CID resulted in dissociation of most adducts. For Cd, Cu, and Ni, only the bare metal ions were observed when in-source CID was utilized. For Pb, higher-order water adducts were eliminated, and only the bare elemental ions and adducts involving the addition of a single water were observed. For U, in-source CID resulted in the bare UO$_2^+$ ion being most abundant, though water and hydroxide adducts were still present in the mass spectrum. Across the full mass range of FIGS. 18A and 18B, resolution (m/Δm) was in excess of 100,000, well within the range specified by the instrument manufacturer.

Detection limits and precision of SCGD-MS were measured for the strongest signal (bare elemental ion or adduct) for Cu, Cd, Cs, Pb, and U and the results are compiled in Table 2. Surprisingly, despite the large number of adducts formed for most elements, which result in dispersion of the signal across many m/z channels, detection limits for SCGD-MS remained at levels useful for trace analyses, ranging from 0.1 to 4 ppb. Precision was found to be better than 16% RSD at 1000-ppb concentration. These precision values are somewhat worse than those obtained with SCGD and optical emission spectrometry, where RSD values in the range of 0.5-3.5% are common. No gas flows or electrostatic fields, apart from the vacuum pull of the first stage of the mass spectrometer and potential applied to the SCGD anode, were used to direct ions from the SCGD into the capillary of the mass spectrometer.

TABLE 2

Detection limits and precision of SCGD-MS for elemental species with and without in-source CID.

| | | SCGD, without in-source CID | | | SCGD, with in-source CID | |
|---|---|---|---|---|---|---|
| Element | Form Measured* | Detection Limit (ppb) | RSD† (%) | Form Measured* | Detection Limit (ppb) | RSD† (%) |
| Cd | [CdNO$_3$ + 2(H$_2$O)]$^+$ | 0.1 | 10 | Cd$^+$ | 0.4 | 10 |
| Cs | Cs$^+$ | 0.4 | 11 | Cs$^+$ | 0.3 | 5 |

TABLE 2-continued

Detection limits and precision of SCGD-MS for elemental species with and without in-source CID.

| | SCGD, without in-source CID | | | SCGD, with in-source CID | | |
|---|---|---|---|---|---|---|
| Element | Form Measured* | Detection Limit (ppb) | RSD† (%) | Form Measured* | Detection Limit (ppb) | RSD† (%) |
| Cu | $[Cu + (H_2O)_2]^+$ | 4 | 16 | $Cu^+$ | 5 | 11 |
| Pb | $[Pb + H_2O]^+$ | 0.2 | 7 | $Pb^+$ | 0.6 | 9 |
| U | $[UO_2 + OH + H_2O]^+$ | 0.8 | 8 | $(UO_2)^+$ | 0.4 | 7 |

*Detection limits were determined from the sum of all isotopic signals of the form specified.
†Measured at a concentration of 1000 ppb with 5 repetitions (9.4-s integration).

Though in-source CID simplifies SCGD mass spectra, as shown in FIGS. 18A and 18B, it has little effect on quantitative analytical performance Detection limits and precision of Cu, Cd, Cs, Pb, and U with in-source CID (40 V) are also included in Table 2. As before, the form of an element that produced the strongest ion signal was utilized for determining detection limits and precision—with CID, this was the bare elemental ion for all elements except U, where $UO_2^+$ was most abundant. With in-source CID, SCGD-MS detection limits ranged from 0.3 to 5 ppb; closely comparable to those obtained when CID was not used (0.1-4 ppb). Precision was generally similar also, from 5 to 11% RSD with in-source CID.

Linear dynamic range for elemental analysis was also assessed. A working curve for Cs was measured over the range of 0.5-100,000 ppb, with standards introduced in half-decade concentration increments. It was found that Cs signal was linear from 0.5-10,000 ppb (log-log plot slope of 0.97±0.03, $R^2$=0.99415), after which roll-off became apparent. If the Cs signal is assumed to maintain linearity to the 0.4-ppb detection limit, this corresponds to a linear working range of 4.4-orders of magnitude. Beyond a concentration of 10,000 ppb, $Cs^+$ signal leveled off, while signal from the nitrate-bound dimer, $(Cs_2NO_3)^+$, rose substantially. Dimer signal was apparent even at low concentrations (5 ppb), and is likely the reason the log-log slope is slightly less than one even over the linear portion of the Cs working curve. When the Cs curve was measured with in-source CID (40 V), roll-off still occurred at 10,000 ppb, despite the attenuation of the dimer signal.

Example 21. Uranyl Nitrate

Figure 19:
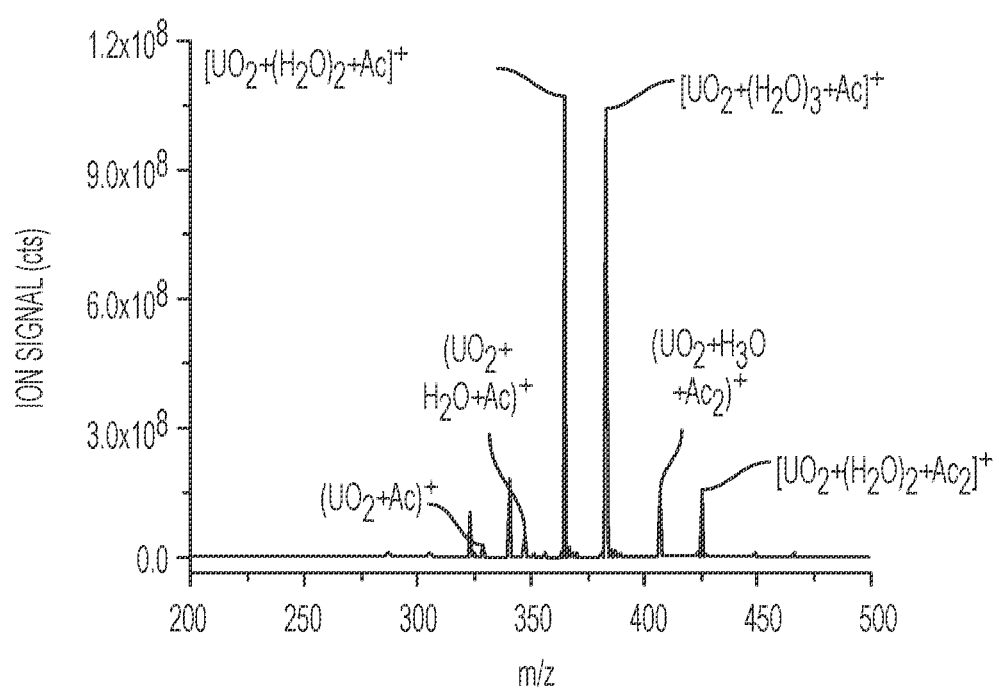
FIG. 19 is a mass spectrum of a 5-mM $UO_2^{2+}$ solution in 0.1 M $HNO_3$ with 1% (w/w) acetic acid produced using the mass spectrometer and SCGD of FIG. 9.
Figure 20:
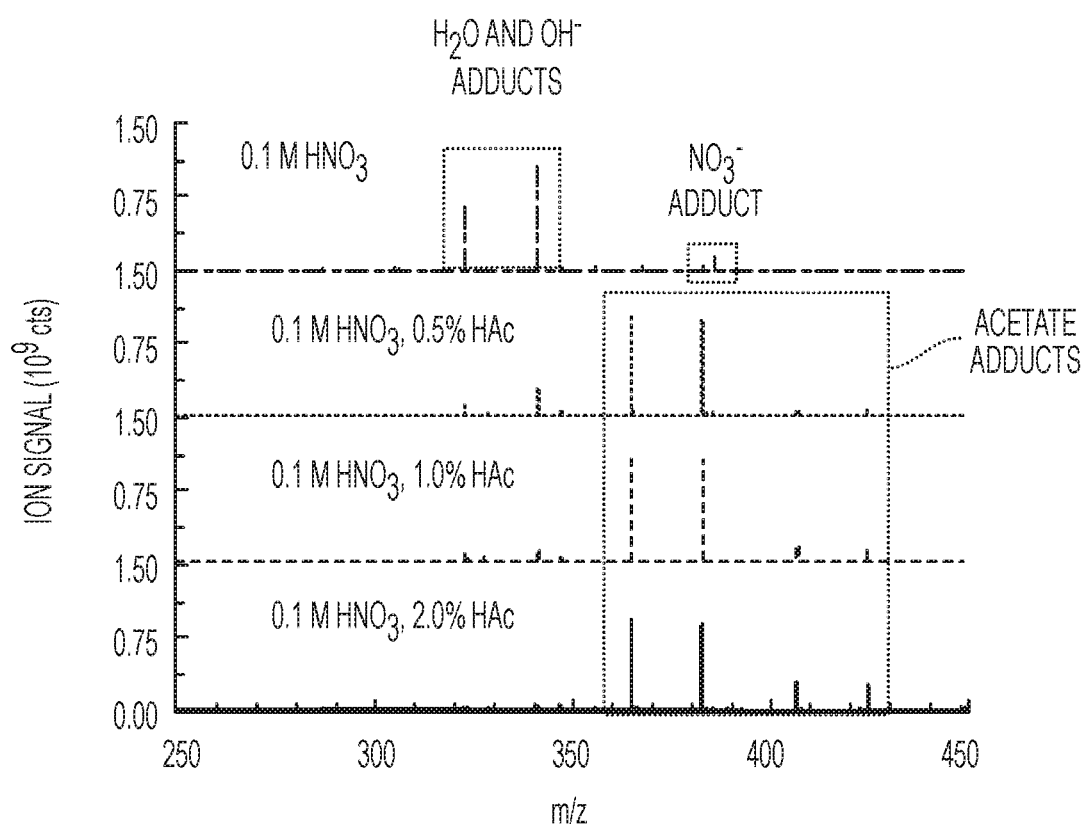
FIG. 20 is an overlay of mass spectra of 5-mM $UO_2^{2+}$ in 0.1 M $HNO_3$ with varied amounts of acetic acid produced using the mass spectrometer and SCGD of FIG. 9.

FIG. 19 shows the mass spectrum when 5-mM uranyl nitrate, $UO_2(NO_3)_2$, was introduced into the SCGD in a solution containing 1% (w/w) acetic acid (Ac) and 0.1 M $HNO_3$. Unlike the spectrum of FIG. 18A, in which uranyl was introduced in 0.1 M $HNO_3$, the presence of acetic acid resulted in a shift of the uranyl adducts to higher m/z values. This shift results from the addition of acetate ($CH_3COO^-$) anions to the uranyl cation. Furthermore, as acetic acid concentration was increased, signals from uranyl adducts bound to two acetate ions became more pronounced, as shown in FIG. 20. This behavior suggests the ability of the SCGD to provide elemental speciation information.

Example 22. Molecular Analysis

Figure 21A:
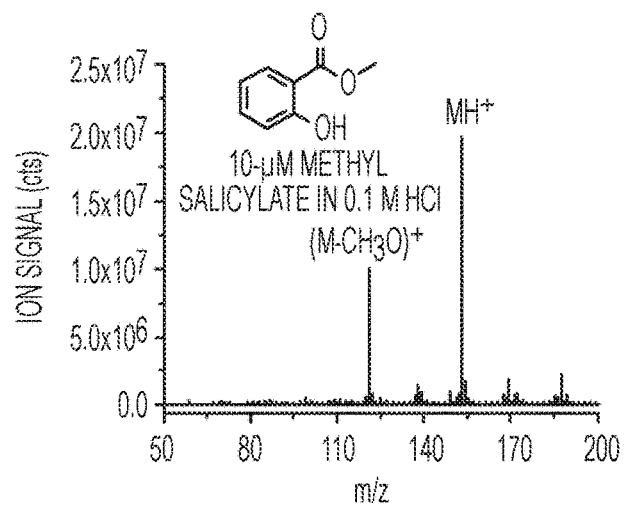
FIG. 21A is a mass spectrum of 10-µM methyl salicylate in 0.1 M HCl produced using the mass spectrometer and SCGD of FIG. 9 at an SCGD current of 70 mA.
Figure 21B:
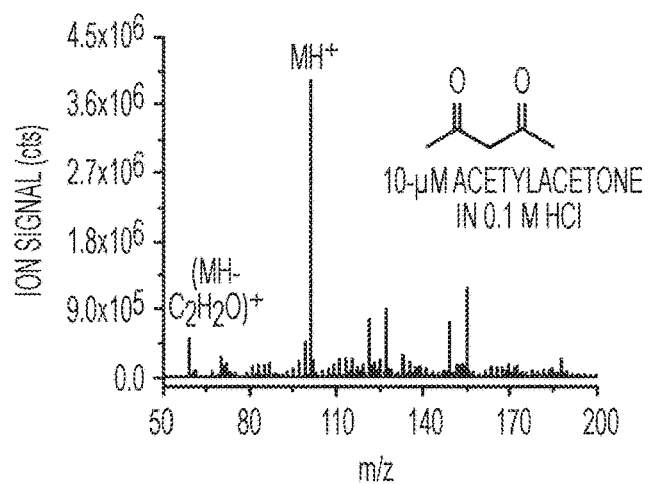
FIG. 21B is a mass spectrum of 10-µM acetylacetone in 0.1 M HCl produced using the mass spectrometer and SCGD of FIG. 9 at an SCGD current of 70 mA.
Figure 21C:
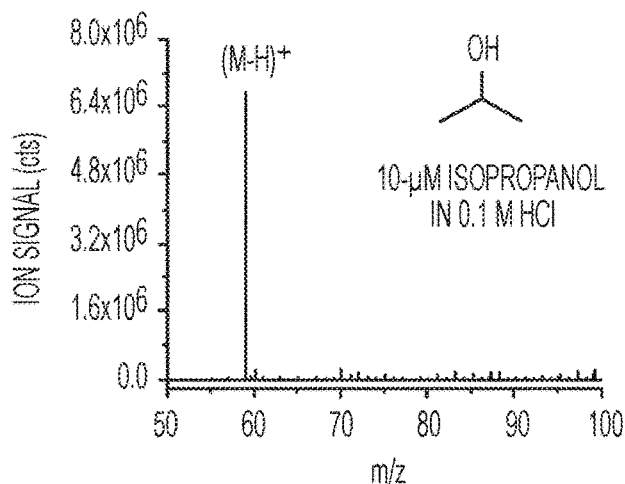
FIG. 21C is a mass spectrum of 10-µM isopropanol in 0.1 M HCl produced using the mass spectrometer and SCGD of FIG. 9 at an SCGD current of 70 mA.

It was found that the SCGD can efficiently produce intact molecular ions from solution; three examples for 10-µM methyl salicylate, acetylacetone and isopropanol are shown in FIG. 21A-21C. For both methyl salicylate and acetylacetone, the SCGD generated the protonated molecular ion ($MH^+$) and fragments. Isopropanol exhibited only a single peak corresponding to the loss of a hydrogen atom, likely a result of hydride abstraction facilitated by $NO^+$, known to occur in chemical ionization sources. No change in SCGD conditions or electrolyte composition was used to produce these ions.

Figure 4:
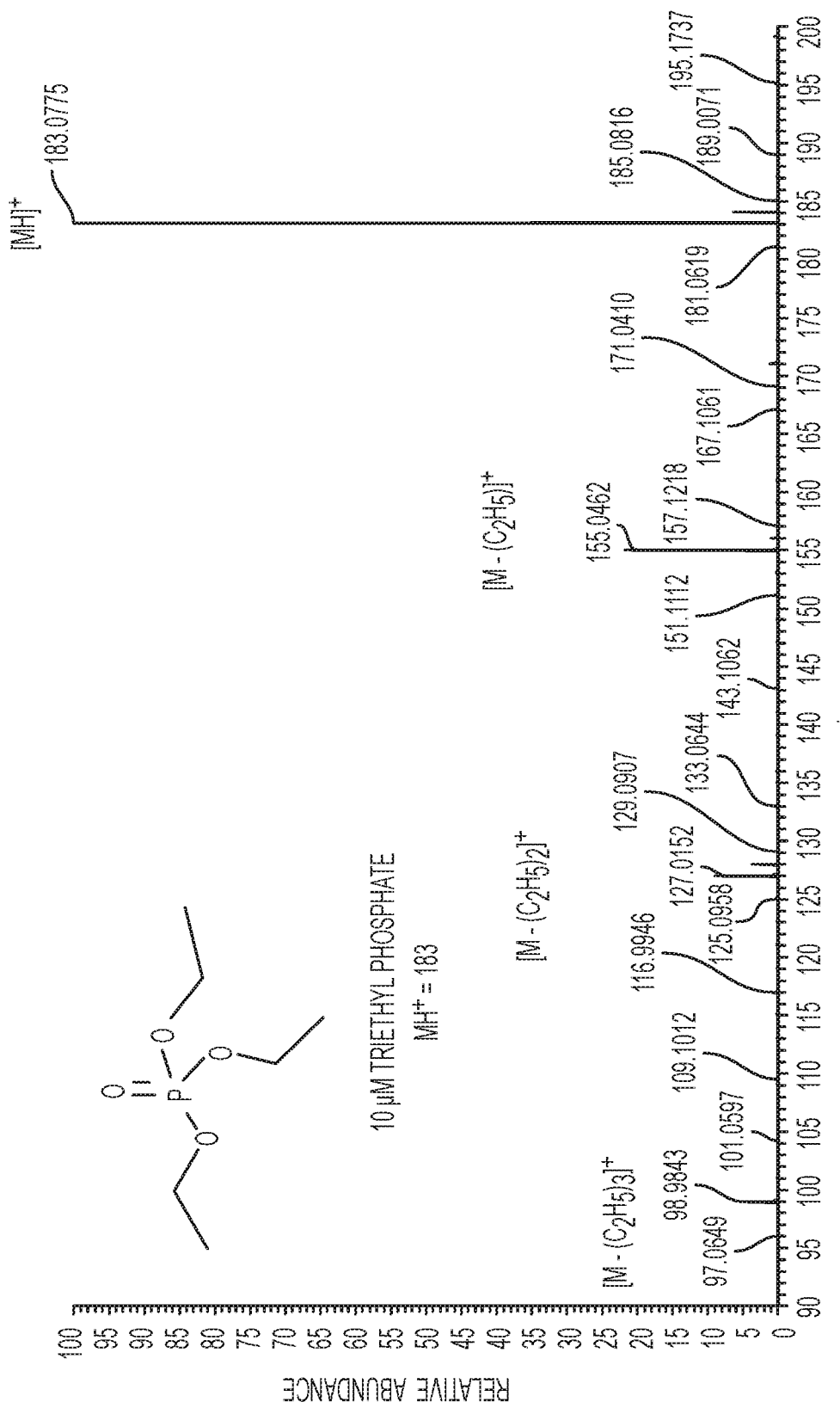
FIG. 4 is a mass spectrum of a 10 μM triethyl phosphate solution containing 0.1M hydrochloric acid produced using the mass spectrometer and SCGD of FIG. 2.
Figure 22:
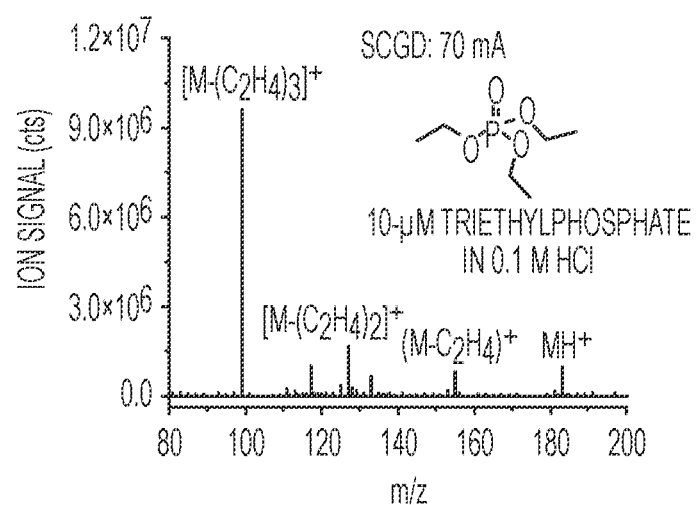
FIG. 22 is a mass spectrum of 10-µM triethyl phosphate in 0.1 M HCl produced using the mass spectrometer and SCGD of FIG. 9 at an SCGD current of 35 mA.

A solution containing 10-µM of a chemical warfare agent simulant, triethyl phosphate (TEP), was introduced into the SCGD in a carrier stream of 0.1 M HCl. At an SCGD current of 35 mA, the protonated molecular ion ($MH^+$) of TEP at m/z 183.078 is the most abundant species, as shown in FIG. 4, though fragment ions, corresponding to successive losses of ethyl groups ($C_2H_4$), were also detected. At the higher SCGD current of 70 mA, the fragment ion at m/z 98.984, corresponding to the loss of all three ethyl groups from TEP, became the base peak, as shown in FIG. 22. To assess differences in the "hardness" of ionization between the two current levels, survival yields (SY, a value directly related to hardness of ionization) were calculated from the formula $$SY = \frac{S_p}{S_p + \sum S_f} \quad (2)$$

where $S_p$ and $S_f$ are the mass spectral signals of the parent and fragment ions, respectively. Here, SY was 25.5% and 78.3% for currents of 70 and 35 mA, respectively, indicating that the ionization process is "harder" (i.e. higher energy) at higher current (70-mA) and that fragmentation can be easily tuned by adjusting the source current. Interestingly, the trend in fragmentation with SCGD current here is reversed from that in the earlier study of the SCGD-based analysis of biopolymers, where low currents produced extensive fragmentation and high currents produced intact ions.

Although detection limits for molecular species introduced in solution were not quantitatively determined, a rough estimate can be derived from the signal strength at concentrations used here. If the signal is assumed to drop linearly from 10-µM concentration and the detection limit is conservatively estimated to occur at a signal level of $10^3$ counts, the protonated molecular ion of TEP, measured with an SCGD current of 35 mA, would produce a detection limit of 1 nM (0.2 ppb).

Example 23. Acetone and Acetylacetone Gases

Figure 23A:
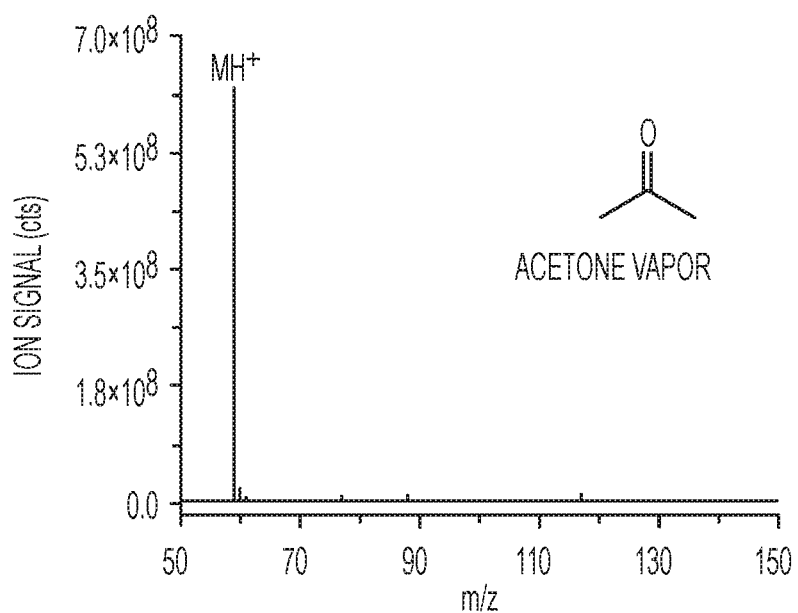
FIG. 23A is a mass spectrum of acetone vapor produced using the mass spectrometer and SCGD of FIG. 9.
Figure 23B:
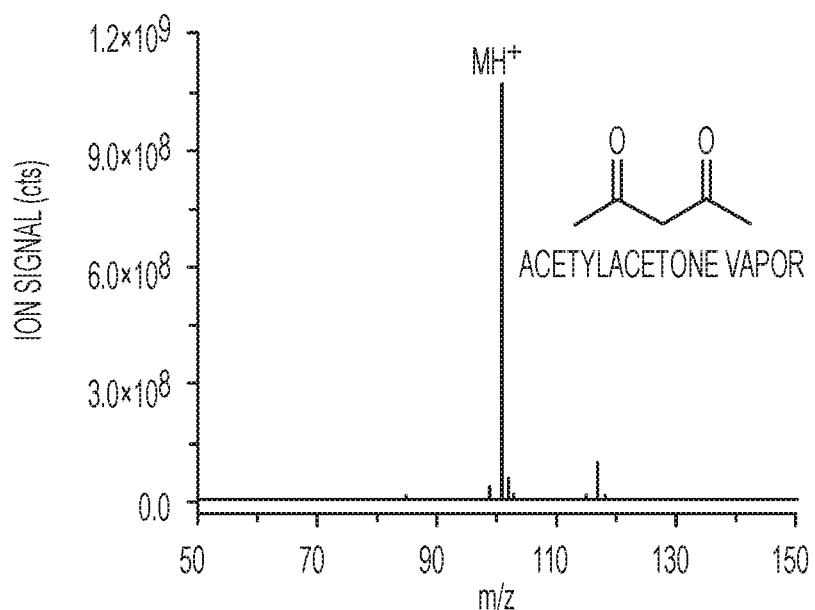
FIG. 23B is a mass spectrum of acetylacetone vapor produced using the mass spectrometer and SCGD of FIG. 9.

The SCGD can also ionize ambient, molecular gases. A bottle containing an organic solvent (either acetone or acetylacetone) was opened and placed on a laboratory bench approximately two meters from the SCGD and mass spectrometer inlet. Within seconds, the protonated molecular ion of both acetone and acetylacetone solvents was present at high abundance in the SCGD mass spectrum, as shown in FIGS. 23A and 23B, respectively. FIGS. 23A-B demonstrate the capability of the SCGD to ionize ambient vapors.

Example 24. Solid Samples

Figure 24A:
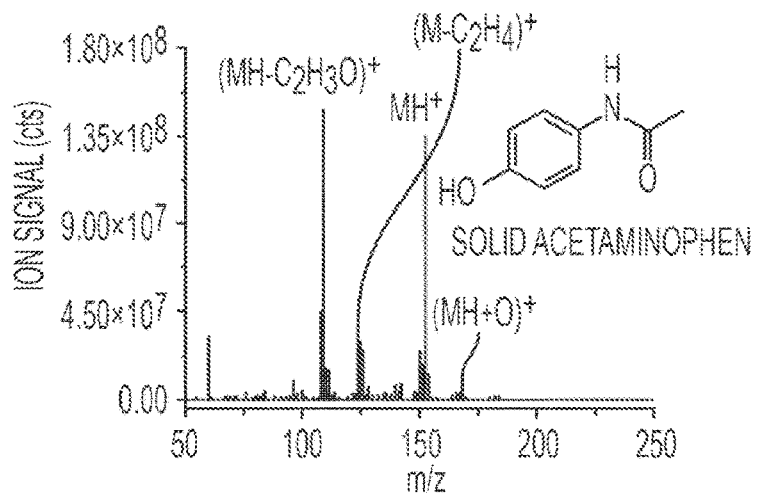
FIG. 24A is a mass spectrum of solid caffeine deposited on a glass probe produced using the mass spectrometer and SCGD of FIG. 9 at a current of 70 mA with a blank support solution of 0.1 M $HNO_3$.
Figure 24B:
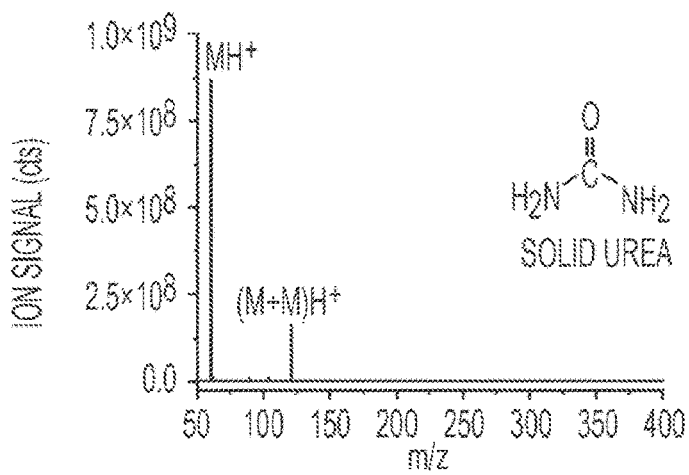
FIG. 24B is a mass spectrum of acetaminophen deposited on a glass probe produced using the mass spectrometer and SCGD of FIG. 9 at a current of 70 mA with a blank support solution of 0.1 M $HNO_3$.
Figure 24C:
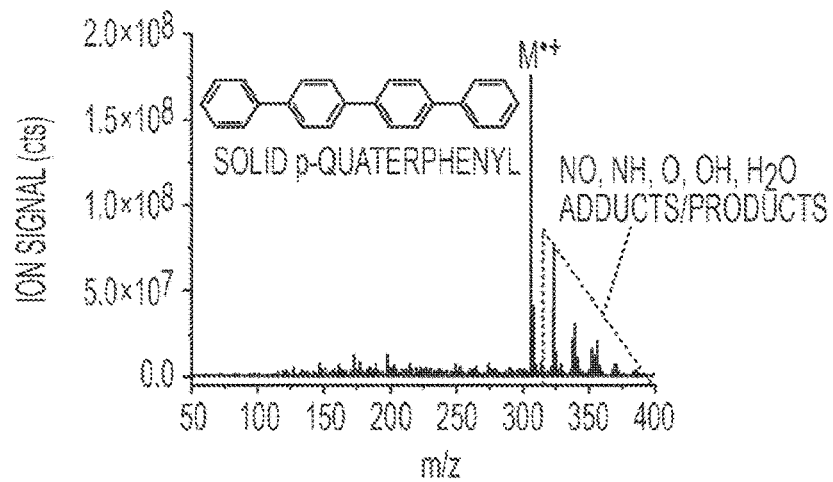
FIG. 24C is a mass spectrum of urea deposited on a glass probe produced using the mass spectrometer and SCGD of FIG. 9 at a current of 70 mA with a blank support solution of 0.1 M $HNO_3$.

The SCGD produced gas-phase ions from molecular species also introduced as solids. For this demonstration, the SCGD was sustained with a blank support solution (0.1 M $HNO_3$) while a solid sample, deposited on the tip of a glass probe, was held between the SCGD and inlet of the mass spectrometer. When caffeine deposited on a glass probe was held within 2 cm of the SCGD, the protonated molecular ion ($MH^+$) of caffeine at m/z 195.087 immediately appeared in the mass spectrum, as shown in FIG. 5. Though the protonated form was most abundant, oxidation products and a fragment that results from them (loss of CO) were also present in the spectrum. Other small, polar molecules behaved similarly to caffeine when introduced as solids; FIGS. 24A and 24B show mass spectra for acetaminophen and urea, respectively. As with caffeine, $MH^+$ was highly abundant in both spectra and acetaminophen also exhibited fragments and oxidation products. Unlike caffeine or acetaminophen, urea produced a proton-bound dimer, while no fragments of urea were observed in the mass spectrum. FIG. 24C shows the SCGD mass spectrum obtained from the non-polar molecular p-quaterphenyl deposited on a glass probe. In contrast to the polar molecules, the radical molecular cation ($M.^+$) was the most abundant species, and a larger variety of adducts involving NO, NH, O, OH, and $H_2O$ were found in the spectrum.

The present disclosure demonstrates that small molecules, such as pharmaceuticals and chemical-warfare agent simulants, may be volatilized and ionized by the SCGD and detected with mass spectrometry or ion mobility spectrometry. If desired by the operator, these analytes may also be fragmented by adjusting the source conditions, such as amperage. Intact small molecule ions or fragment ions may be detected when the analyte is introduced via the flowing liquid or external to the discharge (e.g., held near the SCGD plasma). The ability to loft labile biomolecules into the gas phase and form ions was demonstrated with small peptides and proteins introduced into the flowing liquid. The peptides were fragmented and ionized at alternative SCGD currents. Peptide sequence was trivial to derive from the resulting mass spectra.

What is claimed is:

1. A method for ionizing a molecular analyte, the method comprising:
    contacting the molecular analyte with a plasma discharge under ambient conditions to form ions by flowing an electrically conductive liquid through a capillary onto a first conductive rod that surrounds the capillary and applying an electric potential to a second conductive rod such that the plasma discharge forms between the second conductive rod and the electrically conductive liquid to produce the ions, and
    separating the ions in a mass spectrometer.

2. The method of claim 1, wherein the molecular analyte is not multiply charged.

3. The method of claim 1, wherein the molecular analyte is electrically neutral.

4. The method of claim 1, wherein the molecular analyte is not subjected to a subsequent fragmenting step after the contacting step.

5. The method of claim 1, wherein the molecular analyte is dissolved in the electrically conductive liquid.

6. The method of claim 1, wherein the molecular analyte is a solid.

7. The method of claim 1, wherein the molecular analyte is a polypeptide.

8. The method of claim 1, wherein the ions are polypeptide sequence ions each having a type selected from the group consisting of a-ions, b-ions, c-ions, x-ions, y-ions, d-ions, v-ions, and w-ions.

9. The method of claim 7, wherein the polypeptide has been digested with an enzyme.

10. The method of claim 1, wherein the molecular analyte is a chemical complex.

11. The method of claim 1, wherein the molecular analyte is a charged molecular analyte.

12. The method of claim 1, wherein the plasma discharge is generated by an electric current of about 35 mA to about 95 mA.

13. The method of claim 12, further comprising varying the electric current between a high current and a low current, wherein the high current is from about 50 mA to about 200 mA, and the low current is from about 1 mA to about 50 mA.

14. The method of claim 1, wherein the method does not comprise reducing pressure where the plasma discharge forms.

15. The method of claim 1, wherein the molecular analyte is dissolved in an electrically conductive liquid that flows toward the plasma discharge at a rate of about 1 mL/min to about 5 mL/min.

16. The method of claim 1, wherein the molecular analyte is dissolved in an electrically conductive liquid that comprises an electrolyte solute.

17. The method of claim 16, wherein the concentration of the electrolyte solute is about 0.05M to about 2M.

18. The method of claim 1, wherein the plasma discharge is about 0.2 cm to about 1 cm from an inlet of the mass spectrometer.

* * * * *